(12) United States Patent
Aoshima et al.

(10) Patent No.: US 8,583,389 B2
(45) Date of Patent: Nov. 12, 2013

(54) BATTERY CONTROL DEVICE

(75) Inventors: Yoshinori Aoshima, Hitachinaka (JP); Masahiro Ueda, Hitachinaka (JP); Youhei Kawahara, Hitachi (JP); Kouji Higashimoto, Hitachinaka (JP)

(73) Assignees: Hitachi Vehicle Energy, Ltd., Hitachinaka-shi (JP); Hitachi, Ltd., Tokyo (JP)

( * ) Notice: Subject to any disclaimer, the term of this patent is extended or adjusted under 35 U.S.C. 154(b) by 636 days.

(21) Appl. No.: 12/686,095

(22) Filed: Jan. 12, 2010

(65) Prior Publication Data

US 2010/0185405 A1 Jul. 22, 2010

(30) Foreign Application Priority Data

Jan. 13, 2009 (JP) ................................. 2009-004724

(51) Int. Cl.
*G01R 31/36* (2006.01)

(52) U.S. Cl.
USPC .......................................................... 702/63

(58) Field of Classification Search
USPC .......................................................... 702/63
See application file for complete search history.

(56) References Cited

U.S. PATENT DOCUMENTS

| 7,498,772 B2 * | 3/2009 | Palladino .................... 320/132 |
| 2005/0017685 A1 * | 1/2005 | Rees et al. .................. 320/132 |
| 2010/0156356 A1 | 6/2010 | Asakura et al. |

FOREIGN PATENT DOCUMENTS

| JP | 2003-132959 A | 5/2003 |
| JP | 2007-108063 A | 4/2007 |
| JP | 2008-253129 A | 10/2008 |
| WO | WO 2008/108102 A1 | 9/2008 |

OTHER PUBLICATIONS

Japanese Office Action dated Aug. 14, 2012 including English-language translation (Five (5) sheets).

* cited by examiner

*Primary Examiner* — Aditya Bhat
(74) *Attorney, Agent, or Firm* — Crowell & Moring LLP

(57) ABSTRACT

A plurality of resistance value tables of a battery group with respect to temperature and SOC of the assembled battery, which are measured in advance when currents of different change patterns flow in the assembled battery, are stored. A resistance value for the assembled battery is calculated, based upon its voltage and current. From among the plurality of resistance value tables, a resistance value table is selected so that it corresponds to the change pattern of the current flowing in the assembled battery when the voltage and the current of the assembled battery were measured, and a resistance value is searched for from that resistance value table corresponding to the temperature and the SOC of the assembled battery. Then the calculated resistance value and the one from the table are compared to determine the life of the assembled battery.

6 Claims, 9 Drawing Sheets

BATTERY CONTROL DEVICE

INCORPORATION BY REFERENCE

The disclosure of the following priority application is herein incorporated by reference: Japanese Patent Application No. 2009-004724 filed Jan. 13, 2009.

BACKGROUND OF THE INVENTION

1. Field of the Invention

The present invention relates to a control device for a battery.

2. Description of the Related Art

In the prior art, with a hybrid vehicle (HEV: hybrid electric vehicle) in which both an internal combustion engine and an electric motor are used together, or with an electric automobile (PEV: plug-in electric vehicle) that travels using only an electric motor, a battery assembly is used as the power supply for the electric motor, in which a plurality of battery modules, such as for example secondary lithium ion batteries or the like, are connected in series and series-parallel. Consideration is given by a charge/discharge control device for these secondary lithium ion batteries to the amount of charge of each of the battery cells (SOC: State Of Charge), to its temperature, to its internal resistance, and so on; and a current value or a power value is calculated within a permissible range such that none of the battery cells is subjected to excessive charge state or an excessive discharge state, and this value is notified to a motor controller that drives the electric motor.

Now, the internal resistance of each of these secondary lithium ion batteries changes drastically according to its temperature, and its internal resistance at low temperature is several times as great as at high temperature. The value of the internal resistance also changes according to differences in SOC, and has a tendency to be larger, the lower is the SOC. Moreover since, when a high current is discharged from the battery, the battery itself generates heat and thus its internal resistance changes, accordingly the internal resistance also varies according to the flow of discharge current, and this effect is particularly notable at low temperature.

Due to this, a technique has been disclosed in which the temperature dependence of the internal resistance of the battery is corrected using a temperature characteristic function that includes one or more exponential terms, and the states of deterioration of the secondary batteries are determined by estimating their internal resistances at a predetermined reference temperature (for example, refer to Japanese Laid-Open Patent Publication 2007-108063).

SUMMARY OF THE INVENTION

However, with the prior art type battery control device described above, there has been the problem that it is not possible to determine the battery life accurately, since no consideration is taken of the state of heating of the battery and so on, and in particular, if a large current flows at low temperature, the internal temperature of the battery changes, so that it is not possible to calculate an accurate resistance value.

According to the 1st aspect of the present invention, a battery control device, comprises: a voltage measurement unit that measures a voltage of a assembled battery in which a plurality of battery cells are connected together; a current measurement unit that measures a current flowing in the assembled battery and a change pattern of that current; a temperature measurement unit that measures a temperature of the assembled battery; a SOC detection unit that detects a state of charge (SOC) of the assembled battery; a storage unit that stores a plurality of resistance value tables of the assembled battery with respect to the temperature and the SOC of the assembled battery, measured in advance when currents of different change patterns flow in the assembled battery; a calculation unit that calculates a resistance value for the assembled battery, based upon the voltage and the current of the assembled battery; a search unit that selects, from among the plurality of resistance value tables stored in the storage unit, a resistance value table that corresponds to a change pattern of the current flowing in the assembled battery when the voltage and the current of the assembled battery were measured, and finds a resistance value from that resistance value table corresponding to the temperature and the SOC of the assembled battery when the voltage and the current of the assembled battery were measured; and a determination unit that compares together the resistance value calculated by the calculation unit and the resistance value found by the search unit, and determines a life for the assembled battery.

According to the 2nd aspect of the present invention, in a battery control device according to the 1st aspect, it is preferred that in the plurality of resistance value tables stored in the storage unit, there are included a first resistance value table for when a constant current flows in the assembled battery while the temperature of the assembled battery is at a normal temperature within a predetermined range, and a second resistance value table for when a current of a specified change pattern flows in the assembled battery while the temperature of the assembled battery is at a temperature lower than a predetermined temperature; and the search unit selects the first resistance value table or the second resistance value table, according to the change pattern of the current flowing in the assembled battery and the temperature of the assembled battery.

According to the 3rd aspect of the present invention, a battery control device that controls a storage battery system in which a plurality of assembled batteries, in each of which a plurality of unit batteries are connected, are connected in series, or in parallel, or in series-parallel, comprises: a voltage measurement unit that measures a voltage of each assembled battery; a current measurement unit that measures a current flowing in the each assembled battery and a change pattern of the current; a temperature measurement unit that measures a temperature of the each assembled battery; a SOC detection unit that detects a state of charge (SOC) of the each assembled battery; a storage unit that stores a plurality of resistance value tables of the each assembled battery with respect to the temperature and the SOC of the each assembled battery, measured in advance when currents of different change patterns flow in the each assembled battery; a calculation unit that calculates a resistance value for the each assembled battery, based upon the voltage and the current of the each assembled battery; a search unit that selects, from among the plurality of resistance value tables stored in the storage unit, a resistance value table that corresponds to the change pattern of the current flowing in the each assembled battery when the voltage and the current of the each assembled battery was measured, and finds resistance values from the selected resistance value table corresponding to the temperature and the SOC of the each assembled battery when the voltage and the current of the each assembled battery were measured; and a determination unit that compares together, for the each assembled battery, the resistance value calculated by the calculation unit and the resistance value found by the search unit, and determines a life for the each assembled battery.

According to the 4th aspect of the present invention, in a battery control device according to the 3rd aspect, wherein: in the plurality of resistance value tables stored in the storage unit, there are included a first resistance value table for when a constant current flow in the each assembled battery while the temperature of the each assembled battery is at a normal temperature within a predetermined range, and a second resistance value table for when a current of a specified change pattern flows in the each assembled battery while the temperature of the each assembled battery is at a temperature lower than a predetermined temperature; and the search unit selects the first resistance value table or the second resistance value table, according to the change pattern of the current flowing in the each assembled battery and the temperature of the each assembled battery.

According to the 5th aspect of the present invention, in a battery control device that is used together with a power conversion device that converts DC power of a assembled battery in which a plurality of unit batteries are connected into AC power and supplies that AC power to a predetermined load, and that performs a life decision for the assembled battery upon receipt of a command from the power conversion device to flow a current of a predetermined change pattern from the assembled battery to the predetermined load and to perform a life decision for the assembled battery, comprises: a voltage measurement unit that measures a voltage of the assembled battery; a current measurement unit that measures a current flowing in the assembled battery; a temperature measurement unit that measures a temperature of the assembled battery; a SOC detection unit that detects a state of charge (SOC) of the assembled battery; a storage unit that stores a resistance value table of the assembled battery with respect to the temperature and the SOC of the assembled battery, measured in advance when current of the predetermined change pattern flows in the assembled battery; a calculation unit that calculates a resistance value for the assembled battery, based upon the voltage and the current of the assembled battery; a search unit that finds a resistance value from the resistance value table in the storage unit, corresponding to the temperature and the SOC of the assembled battery when the voltage and the current of the assembled battery were measured; and a determination unit that compares together the resistance value calculated by the calculation unit and the resistance value found by the search unit, and determines a life for the assembled battery.

According to the 6th aspect of the present invention, in a battery control device that is used together with a power conversion device that converts DC power of a storage battery system in which a plurality of assembled batteries, in each of which a plurality of unit batteries are connected, and that are connected in series, or in parallel, or in series-parallel, into AC power and supplies the AC power to a predetermined load, and that performs life decisions for the assembled batteries upon receipt of a command from the power conversion device to flow a current of a predetermined change pattern from the battery group to the predetermined load and to perform life decisions for the assembled batteries, comprises: a voltage measurement unit that measures a voltages of each assembled battery; a current measurement unit that measures a current flowing in the each assembled battery; a temperature measurement unit that measures a temperatures of the each assembled battery; a SOC detection unit that detects a state of charge (SOC) of the each assembled battery; a storage unit that stores a resistance value table of the each assembled battery with respect to the temperature and the SOC of the each assembled battery, measured in advance when current of the predetermined change pattern flows in the each assembled battery; a calculation unit that calculates a resistance value for the each assembled battery, based upon the voltage and the current of the each assembled battery; a search unit that, for the each assembled battery, finds a resistance value from the respective resistance value table for the each assembled battery in the storage unit, corresponding to the temperature and the SOC of the each assembled battery when the voltage and the current of the each assembled battery were measured; and a determination unit that, for the each assembled battery, compares together the resistance value calculated by the calculation unit and the resistance value found by the search unit, and determines a life for the each assembled battery.

According to the present invention it is possible to select, from among a plurality of resistance value tables, a resistance value table that matches the state of use of the battery, so that it is possible to determine the battery life accurately.

DESCRIPTION OF THE PREFERRED EMBODIMENTS

In the embodiments explained below, the present invention is explained by giving examples of use thereof as a drive power supply for a drive system for a large sized hybrid vehicle. Such a large sized hybrid vehicle may be a public vehicle such as a hybrid bus or the like, or a cargo vehicle such as a hybrid truck or the like. The embodiment below will be described in terms of a hybrid bus. Moreover, the structure of the embodiment described below is not limited to application to a hybrid automobile; it may also be applied to an electric automobile or a hybrid train or the like, or indeed to any machine or device whose source of electrical power is a battery.

<General Structure of this Drive System for a Large Sized Electric Hybrid Vehicle>

Figure 1:
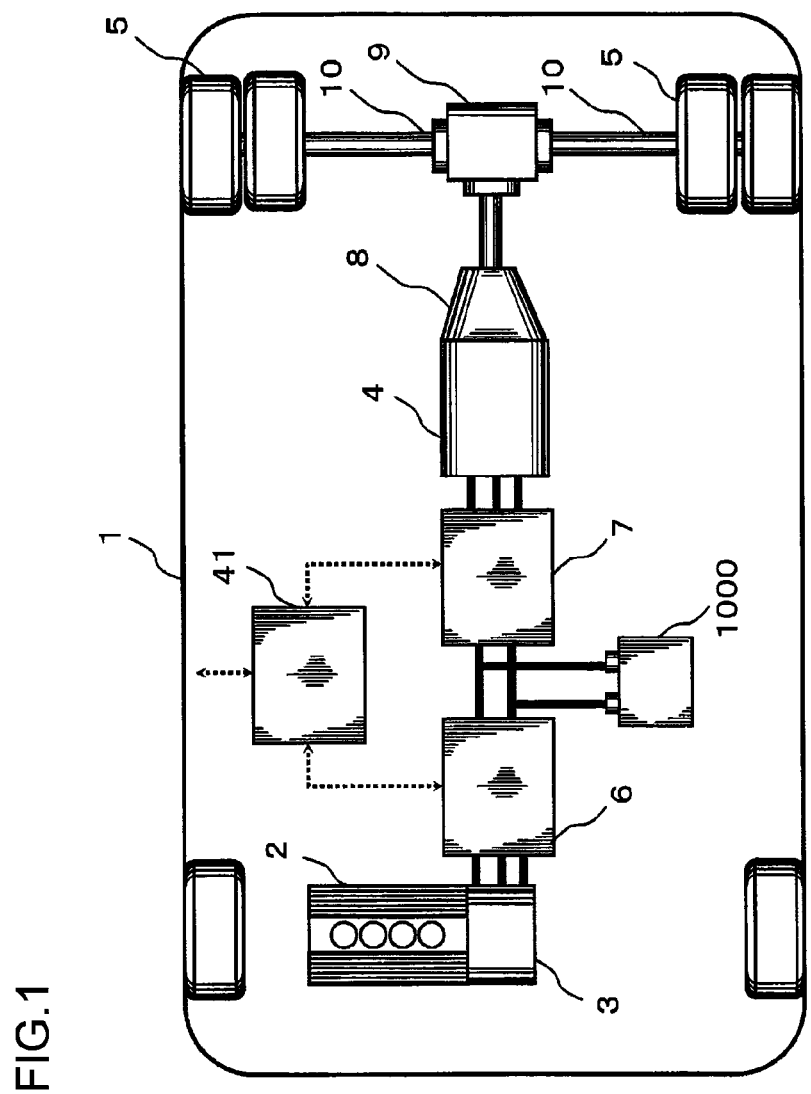
FIG. 1 shows an embodiment of the present invention, wherein the configuration of a drive system for a hybrid vehicle is given in a block diagram.

FIG. 1 shows the general layout of a drive system for a large sized electric hybrid vehicle. The drive system of the hybrid vehicle 1 of this embodiment is constructed according to the so called series hybrid principle, in which energy flows in series from an engine 2 to drive wheels 5: a motor-generator 3 (here this is mainly used as a generator) is driven using the rotational power of the engine 2, that is an internal combustion engine; a motor-generator 4 (here this is mainly used as a motor) is driven using the power generated by this driving of the generator 3; and drive wheels 5 (for example the rear wheels of the vehicle) are driven using rotational power generated by this driving of the motor-generator 4. According to a drive system according to this series hybrid principle, since it is possible to operate the engine 2 in a steady manner in a region in which fuel consumption and exhaust gas quality are most satisfactory, with no direct relationship to driving of the drive wheels 5, accordingly, along with it being possible to improve the fuel consumption as compared with a conventional engine driven vehicle, also it is possible to reduce the amount of nitrogen oxides and so on included in the exhaust gases by half or more.

For a drive system for a hybrid vehicle, it would also be acceptable to employ either: the so-called parallel hybrid principle, in which an engine and a motor-generator are arranged in parallel with respect to the flow of energy to the drive wheels (in terms of construction, the engine and the motor-generator are connected in series via a clutch), so that it is possible to drive the drive wheels by the rotational power of the engine, or by the rotational power of the motor-generator, or by the rotational power of both the engine and the motor-generator; or the series-parallel hybrid principle that is a combination of the series hybrid principle with this parallel hybrid principle (in which it is arranged to branch off part of the rotational power of the engine to an electrical generator for generation of electricity, so that this power is used for generation of electricity, and so that, due to this, it is possible to drive a motor-generator for driving the vehicle with the power thus obtained).

The engine 2 and the motor-generator 3 are provided as a dedicated power generation facility that generates the power needed for driving the motor-generator 4. The engine 2 and the motor-generator 3 are mutually mechanically connected by their rotation shafts being directly coupled together. For this mechanical coupling of the engine 2 and the motor-generator 3, it would also be acceptable to employ a method of fixing pulleys on each of the rotation shafts of the engine 2 and the pulley, and linking them together with a belt.

The engine 2 is a diesel engine that serves as a drive power source for generating the rotational power necessary for driving the motor-generator 3, and that converts thermal energy obtained by combusting a mixture gas of diesel oil and air to mechanical energy (rotational power). It would also be acceptable to use a gasoline engine, a gas engine, a bio-fuel engine, a hydrogen engine or the like as the engine 2. Moreover, it would also be acceptable to arrange to employ some other type of drive power source such as a gas turbine or the like, instead of the engine 2. The drive power produced by the engine 2 is controlled by the driving of a plurality of air valves (throttle valves and intake- and exhaust valves) and the driving of a fuel valve by an engine control device, not shown in the figures, and is controlled by the amount of fuel supplied to the cylinders and by intaking- and outtaking of air.

The motor-generator 3 is a rotating electrical machine that receives the rotational power outputted from the engine 2 and is driven thereby, and that generates the power needed for driving the motor-generator 4; and, in structure, is a three phase AC synchronous rotating electrical machine of the permanent magnet field type that generates three phase AC power using the magnet flux of permanent magnets. Furthermore, when starting the engine 2, the motor-generator 3 generates the driving power for the engine 2, and thus the engine 2 is started. For this motor-generator 3, it would also be acceptable to arrange to employ a coil magnet field type three phase AC synchronous rotating electrical machine that generates three phase AC power using magnetic flux produced by exciting coils, or a three phase AC induction type rotating electrical machine or the like. The generation of power by the generator 3 is controlled by the rotational power outputted from the engine 2, and is controlled by controlling the rotational speed of the motor-generator 3. Moreover, in the case of generating power with a coil magnet field type three phase AC synchronous rotating electrical machine, it is also controlled by controlling the field current that flows in the field coil, simultaneously with controlling the rotational speed of the generator.

A storage battery system (a battery device) 1000, that is a power supply device, is electrically connected to the motor-generator 3 via a first power conversion device 6. And the motor-generator 4 is connected to the storage battery system 1000 via a second power conversion device 7.

The first and second power conversion devices 6 and 7 are control devices that control transfer of power between the motor-generator 3, the storage battery system 1000, and the motor-generator 4, and they include power conversion circuits that include a plurality of semiconductor switching elements (for example MOSFETs: metal oxide semiconductor field effect transistors, or IGBTs: Insulated Gate Bipolar Transistors). The power conversion circuit of the first power conversion device 6 includes a three phase bridge circuit in which three series circuits (one for each phase, i.e. each constituting an arm for one phase) are electrically connected in parallel, with two semiconductor switching elements (one for an upper arm and one for a lower arm) being electrically connected in series in each of these series circuits. And, by controlling the ON/OFF operation of these six semiconductor switching elements, this power conversion circuit converts power between the motor-generator 3 and the storage battery system 1000. Furthermore, the power conversion circuit of the second power conversion device 7 also has a similar structure, and converts power between the storage battery system 1000 and the motor-generator 4 by controlling the ON/OFF operation of its six semiconductor switching elements.

The sides of the upper arms opposite to the connection sides of the lower arms are electrically connected to a DC positive side terminal of the storage battery system 1000, while the sides of the lower arms opposite to the connection sides of the upper arms are electrically connected to a DC negative side terminal of the storage battery system 1000. The midpoints of the arms in the power conversion circuit of the first power conversion device 6, in other words the connection sides of arms and lower arms, are electrically connected to the motor-generator 3. And the midpoints of the arms of the power conversion circuit of the second power conversion device 7, in other words the connection sides of upper arms and lower arms, are electrically connected to the motor-generator 4.

Smoothing capacitors are electrically connected in parallel between the DC positive side terminals and the DC negative side terminals of each of the power conversion circuits. These smoothing capacitors are provided in order to suppress voltage fluctuations generated by the high speed ON/OFF switching operation of the semiconductor switching elements included in these power conversion circuits, and by parasitic inductances in their conversion circuitry. Electrolytic capacitors or film capacitors may be used for these smoothing capacitors.

During generation of power by the motor-generator 3, the first power conversion device 6 that is electrically provided between the generator 3 and the storage battery system 1000 functions as an AC-DC conversion circuit (a rectification circuit) that converts the three phase AC power outputted from the motor-generator 3 to DC power; and, during operation of the motor-generator 3 as an electric motor for engine starting, it functions as a DC-AC conversion circuit (an inverter) that converts the DC power outputted from the storage battery system 1000 into three phase power. On the DC side of this first power conversion device 6, it is electrically connected to the positive and negative terminals of a battery module of the storage battery system 1000. And each of three armature coils of the motor-generator 3 for the three phases is electrically connected to the intermediate point of one of the three series circuits (i.e. between one pair of semiconductor switching elements) included in the power conversion circuit of this first power conversion device 6.

During operation of the motor-generator 4 as an electric motor, the second power conversion device 7 that is electrically provided between the storage battery system 1000 and the motor-generator 4 functions as a DC-AC conversion circuit that converts the DC power outputted from the storage battery system 1000 to three phase AC power; and, during operation of the motor-generator 4 as a generator when performing regenerative braking, this second power conversion device 7 functions as an AC-DC conversion circuit that converts the three phase power outputted from the motor-generator 4 into DC power. On the DC side of this second power conversion device 7, it is electrically connected to the positive and negative terminals of a battery module of the storage battery system 1000. And each of three armature coils of the motor-generator 4 for the three phases is electrically connected to the intermediate point of one of the three series circuits (i.e. between one pair of semiconductor switching elements) included in the power conversion circuit of this second power conversion device 7.

It should be understood that while, here, an example is described in which the first and second power conversion devices 6 and 7 are built as separate units, it would also be acceptable to provide a structure in which they are built as a single unit.

The motor-generator 4 is a source of rotational power for driving the drive wheels 5, and includes an armature (a stator) and a magnetic field system (a rotor) that is rotatably supported so as to oppose the armature; in more detail, this motor-generator 4 is a permanent magnet field type three phase AC synchronous rotating electrical machine that generates the rotational power needed for driving the drive wheels 5, on the basis of the magnetic interaction between a rotating magnetic field that is generated by the three phase AC power supplied to its fixed armature coils and that rotates at synchronous speed, and the magnetic flux of a permanent magnet fitted to its rotor.

And, when the motor-generator 4 is being driven as an electric motor, its armature receives the three phase AC power controlled by the second power conversion device 7 and generates a rotating magnetic field; while, when this motor-generator 4 is being driven as a generator, due to interlinking magnetic flux, three phase AC power is generated in its armature, that includes an iron armature core (a stator core) made from a magnetic material and three phase armature coils (stator coils) fitted onto the armature iron core. And the field coils are elements that generate magnetic flux when the motor-generator 4 is being driven either as an electric motor or as a generator, and includes an iron field core (an iron rotor core) that is made from a magnetic material, and a permanent magnet that is fitted to this iron field core.

For the motor-generator 4, it would also be acceptable to employ a coil magnetic field type three phase AC synchronous rotating electrical machine that generates rotational power on the basis of magnetic interaction between a rotating magnetic field created by three phase AC power supplied to an armature coils and rotating at synchronous speed, and magnetic flux produced by excitation of coils, or a three phase AC induction type rotating electrical machine or the like. In the case of a coil magnetic field type three phase AC synchronous rotating electrical machine, the structure of the armature is fundamentally the same as that of a permanent magnet field type three phase AC synchronous rotatory electrical machine. On the other hand, the structure of the magnetic field system is different, since coils for magnetic field system (rotor coils) are wound upon an iron field core, that is a magnetic material. It should be understood that, with such a coil magnetic field type three phase AC synchronous rotating electrical machine, sometimes a permanent magnet is also installed to the iron field core upon which the coils of magnetic field system are wound, so as to repress leakage of magnetic flux from the coils. Magnetic flux is generated by the coils of magnetic field receiving supply of magnetic field current from an external power supply, thus being excited.

This motor-generator 4 is mechanically connected to the wheel axles 10 of the drive wheels 5 via a transmission 8 and a differential gear 9. The transmission 8 transmits the rotational power outputted from the motor-generator 4 to the differential gear 9, while changing the speed thereof. The differential gear 9 transmits this rotational power outputted from the transmission 8 to the left and right wheel axles 10. The motor-generator 4 and the transmission 8 could also be built as a single unit. The transmission 8 and the differential gear 9 are mechanically connected together by a propeller shaft.

The storage battery system 1000 is a battery system that consists of several hundreds of lithium-ion batteries, so as to have a high rated voltage, for example 600 V or greater. And the storage battery system 1000 is an onboard power supply for powering the vehicle by discharging the power required when the motor-generator 4 is being driven, while being charged up with power to be used for powering the motor-generator 4 by the power generated by the motor-generator 4 during power regeneration and by the power generated by the motor-generator 3. It should be understood that the detailed structure of the storage battery system 1000 will be described hereinafter.

Apart from the motor-generator 4 and the generator 3, electrically operated actuators that supply power to onboard auxiliary machinery (for example, a power steering device and air brakes and so on) and a low voltage battery or the like that is an auxiliary power supply for supplying driving power to electrical equipment in the vehicle (for example, lights, audio, or onboard electronic control devices), whose rated voltages are lower than that of the storage battery system 1000, are electrically connected to the storage battery system 1000 via a DC/DC converter. This DC/DC converter is a voltage raising and lowering device that drops the output voltage of the storage battery system 1000 and supplies it to the electrically operated actuators and the low voltage battery or the like, and also raises the output voltage of the low voltage battery and supplies it to the storage battery system or the like; this DC/DC converter sometimes may also be fitted in the same chassis as the storage battery system 1000. A lead-acid battery of rated voltage 24 V may be used as this low voltage battery. However, for the low voltage battery, it would also be acceptable to use a lithium-ion battery or a nickel-hydrogen battery having the same rated voltage.

The motor-generator 4, the first and second power conversion devices 6 and 7, the motor-generator 3, the engine 2, and the speed change mechanism 8 are disposed in the neighborhood of the differential gear 9, under the floor of the vehicle.

And, in the case of a hybrid bus or a hybrid train of the non-step type or the low floor type, the storage battery system 1000 may be provided on a storage unit that is provided on the roof of the vehicle. In this case, the storage unit is shaped so as to project above the roof. On the other hand, in the case of a hybrid bus of the step type or the high floor type, the storage battery system 1000 may be provided below the floor of the vehicle, and in the neighborhood of the first and second power conversion devices 6 and 7. By providing the storage battery system 1000 in the neighborhood of the first and second power conversion devices 6 and 7, it is possible to shorten the length of the electrical wiring between the first and second power conversion devices 6 and 7 and the storage battery system 1000, and thus it is possible to reduce the inductance of this wiring.

When during powered running of the hybrid vehicle 1 (starting off from rest, acceleration, normal traveling, and so on) the operation of the second power conversion device 7 is controlled by a positive torque command being supplied to a motor control device 11 (see FIG. 2), the DC power stored in the storage battery system 1000 is converted into three phase AC power by the second power conversion device 7, and is supplied to the motor-generator 4. Due to this, the motor-generator 4 is driven and rotational power is generated. This generated rotational power is transmitted to the wheel axles 10 via the speed change mechanism 8 and the differential gear 9, and drives the drive wheels 5. When, due to this driving, the state of charge of the storage battery system 1000 has decreased, the motor-generator 3 is driven by the operation of the engine 2, and three phase AC power is generated. This generated three phase power is converted into DC power by the first power conversion device 6, and is stored in the storage battery system 1000, that is thus charged up.

When during regeneration by the hybrid vehicle 1 (deceleration, braking, and so on) the operation of the second power conversion device 7 is controlled by a negative torque command being supplied to the motor control device 11, the three phase AC power generated from the motor-generator 2 that is being driven by the rotational power of the drive wheels 5 is converted into DC power, and is supplied to the storage battery system 1000. Due to this, this converted DC power is stored in the storage battery system 1000, that is thus charged up.

The motor control device 11, along with calculating a current command value from a torque command value outputted from a higher level control device, also calculates a voltage command value on the basis of the difference between the current command value and the actual current flowing between the motor-generator 4 and the second power conversion device 7, and generates PWM (Pulse Width Modulation) signals on the basis of this calculated voltage command value and outputs this signal to the first and second power conversion devices 6 and 7.

<Overall Structure of the Storage Battery System 1000>

Figure 2:
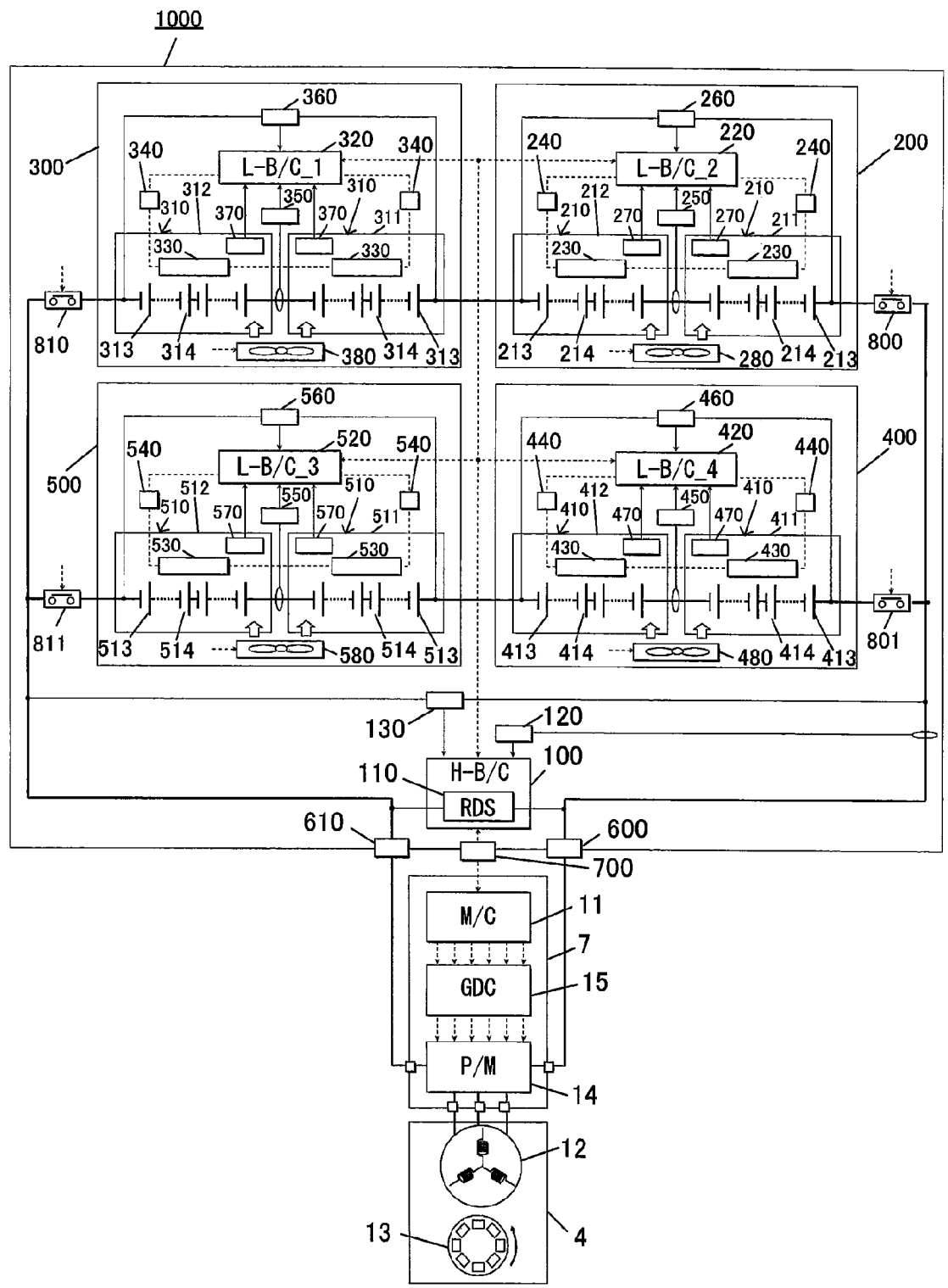
FIG. 2 is a circuit diagram of the electrical connection structure of a storage battery system that is mounted as a drive power supply in FIG. 1.

FIG. 2 shows the overall structure of the storage battery system 1000. As previously described, this storage battery system 1000 is an onboard power supply for the motor-generator 4, and is electrically connected to the motor-generator 4 (to its armature 12) via the second power conversion device 7, so that its charging and discharging are controlled by the second power conversion device 7. The storage battery system 1000 may be broadly divided up as including an master battery control device 100 for the battery as a whole (i.e. a higher level battery control device), a battery module portion that is made from four battery module sets 200, 300, 400, and 500 connected in series-parallel, and first and second positive side main contactors 800 and 801 and first and second negative side main contactors 810 and 811 for controlling electrical connection between the battery module portion and positive and negative terminals 600 and 610. The reference symbol 13 denotes a magnetic field system that includes a plurality of permanent magnets.

The second power conversion device 7 is an electronic device that, by the operation (turning ON and OFF) of semiconductor switching elements, controls the previously described power conversion (conversion of DC power into three phase AC power, or the converse conversion of three phase AC power into DC power), and includes a power module 14 and a driver device 15.

The power module 14 is a component that constitutes the power conversion circuit previously described, and its positive and negative DC electrode sides respectively are electrically connected via the first and second positive side main contactors 800 and 801 and the first and second negative side main contactors 810 and 811 to the positive and negative terminals 600 and 601 that are provided upon the chassis of the storage battery system 1000. Furthermore, this power module 14 performs ON/OFF switching operation according to six drive signals outputted from the driver device 15, one for each of its six arms (each arm including one semiconductor switching element), and thereby converts the DC power outputted from the battery module portion into three phase AC power that it outputs to the motor-generator 4, or conversely converts the three phase AC power outputted from the motor-generator 4 into DC power that it outputs to the storage battery system 1000.

The driver device 15 generates six drive signals for operating the power module 14 on the basis of command signals (PWM signals) outputted from the motor control device 11, and outputs these six drive signals that it generates to the respective gate electrodes of the six semiconductor switching elements. The six semiconductor switching elements are thus turned ON and OFF on the basis of these drive signals outputted from the driver device 15.

The battery module portion is a battery unit that consists of the four battery module sets 200, 300, 400, and 500 electrically connected in series and in parallel, and includes a first battery module block and a second battery module block. The first battery module block consists of the two battery module sets 200 and 300 electrically connected in series. In a similar manner, the second battery module block consists of the two battery module sets 400 and 500 electrically connected in series. And the first battery module block and the second battery module block are electrically connected in parallel.

The first and second positive side main contactors 800 and 801 respectively are provided between the positive sides of the first and second battery module blocks and the positive terminal 600. And the first and second negative side main contactors 810 and 811 respectively are provided between the negative sides of the first and second battery module blocks and the negative terminal 610. The opening and closing of these contactors is controlled by the master battery control device 100, on the basis of opening and closing command signals outputted from a higher ranking control device.

The battery module set 200 is provided with a assembled battery module 210, and with a battery module set control device for managing and controlling the states of this assembled battery module 210.

It should be understood that the battery module sets 300, 400, and 500 have the same structure as the battery module set 200. In the following explanation of the structures of the battery module sets, therefore, only the structure of the battery module set 200 will be explained, as a representative. Thus, in the three or four digit reference numbers for elements of the battery module sets 300, 400, and 500 that have the same structure as the battery module set 200, the last two or three digits are the same for each battery module set. But the leading digit in each reference number is the identifying digit for that battery module set.

The assembled battery module 210 includes two assembled battery blocks (or assembled battery packs), in other words a high potential side assembled battery block 211 and a low potential side assembled battery block 212, that are electrically connected in series. Each of these assembled battery blocks holds assembled batteries. Each of these assembled batteries consists of a plurality of lithium battery cells (lithium cells) that are electrically connected in series.

The battery module set control device consists of a local battery control device (a lower level battery control device) 220 that is on a lower level than the master battery control device 100, and a cell control device 230 that is on an even lower level than that local battery control device 220.

The local battery control device 220 is a device for performing management and control of the state of the assembled battery module 210, and also for notifying the state of the assembled battery module 210 and so on to the master battery control device 100. In this management and control of the state of the assembled battery module 210, the total voltage, total current, temperature and so on of the assembled battery module 210 are measured, the state of charge (SOC) and the state of health (SOH) and so on of the assembled battery module 210 are calculated, commands are outputted to the cell control device 230, and so on.

The charge or discharge current of the assembled battery module 210 is detected by the local battery control device 220 on the basis of the output signal from a current sensor 250 that is electrically connected in series between the high potential side assembled battery block 211 and the low potential side assembled battery block 212. And the total voltage of the assembled battery module 210 is detected by the local battery control device 220 on the basis of the output signal of a voltage sensor 260 that is electrically connected in parallel between the positive and negative electrodes of the assembled battery module 210. Moreover, the temperature of the assembled battery module 210 is detected by the local battery control device 220 on the basis of the output signals of a plurality of temperature sensors 270 that are provided to both the high potential side assembled battery block 211 and the low potential side assembled battery block 212. The total voltages, the charge or discharge currents, and the temperatures detected by the lower level battery controllers are transmitted as information to the master battery control device 100.

The cell control device 230 is a device for managing and controlling the states of a plurality of lithium battery cells according to commands from the local battery control device 220, and consists of a plurality of integrated circuits (ICs). This management and control of the states of a plurality of lithium cells includes measurement of the voltage of each lithium battery cell, regulation of the state of charge of each lithium battery cell, and so on. The integrated circuits are set up so as to correspond to the plurality of lithium cells, and perform management and control of states corresponding to those lithium battery cells to which they correspond.

The battery for auxiliary machinery, that is mounted as a power supply for onboard auxiliary machinery such as for example lights and an audio device and so on, is used as the power supply of this local battery control device 220 (in the case of a large sized vehicle, two nominal 12 V batteries are connected in series to constitute a 24 V battery). Due to this, the voltage from this battery for auxiliary machinery (for example 24V) is supplied to the local battery control device 220. And this local battery control device 220 lowers the supplied voltage (for example to 5 V) with a power supply circuit that consists of a DC/DC converter (a DC-DC power converter), and supplies this lowered voltage as a drive voltage to electronic components that make up the local battery control device 220. The electronic components that make up the local battery control device 220 operate due to this.

As a power supply for the integrated circuitry that makes up the cell control device 230, the plurality of corresponding lithium battery cells are used. Due to this, the cell control device and the assembled battery module 210 are electrically connected together via connection lines (also termed "voltage detection lines", not shown in the figure). The voltage of the highest potential one of the plurality of corresponding lithium battery cells is supplied via connection lines to the integrated circuits. And the integrated circuits lower this supplied voltage (for example to 5 V) with a power supply circuit, and use this as their operating power supply.

The master battery control device 100 is an electronic circuit device that, along with monitoring the state of charge and the operational state and so on of each of the four battery module sets 200, 300, 400, and 500 that make up the battery module portion by implementing communication in parallel with each of these four battery module sets 200, 300, 400, and 500, also performs regulation of the state of charge and anomaly detection and so on for each of the four battery module sets 200, 300, 400, and 500; and it consists of a plurality of electronic circuit components including a microcomputer, implemented upon a circuit substrate. Moreover, this master battery control device 100 controls the opening and closing of the first and second positive side main contactors 800 and 801 and the first and second negative side main contactors 810 and 811, on the basis of control signals from a higher ranking control device. Furthermore the master battery control device 100, along with implementing communication with the higher ranking control device and outputting to the higher ranking control device information specifying the permitted charge or discharge power or the permitted charge or discharge current that can be supplied from the battery module portion or that may be received by the battery module portion, and/or an anomaly detection result, information about the state of charge of the battery module portion, and so on, also inputs a start signal and command signals and so on for opening and closing the first and second positive side main contactors 800, 801 and the first and second negative side main contactors 810 and 811, on the basis of operation of an ignition key switch. By a higher ranking control device is meant the motor control device 11, or a yet higher ranking vehicle control device 41 or the like.

Furthermore, the master battery control device 100 includes a leakage detector 110. This leakage detector 110 is provided between the first and second positive side main contactors 800, 801 and the first and second negative side main contactors 810 and 811, and the power module 14, and is an electric circuit for detecting the presence or absence of leakage between the battery module portion and the vehicle body earth, and includes resistance voltage divider circuits that are electrically connected via a semiconductor switch between respectively the DC positive and negative electrodes and the vehicle body earth. The master battery control device 100, along with controlling the semiconductor switch and electrically connecting the resistance voltage divider circuits between respectively the DC positive and negative electrodes and the vehicle body earth, also reads in voltage information obtained by the resistance voltage divider circuits due to this connection, and decides upon the presence or absence of leakage between the battery module portion and the vehicle body earth. If a leak is present, then the master battery control device 100 notifies this fact to the higher ranking control device, and also issues a warning to the drive by illuminating a warning lamp near the driving seat, or via audio. By doing this, it is possible to allow the vehicle to be driven in a safe manner in a state in which the necessary safety measures are being implemented, and also it is possible to invite the driver to perform the appropriate inspection and/or repairs promptly at a service center.

Furthermore, the master battery control device 100 detects the overall voltage and current of the battery module portion, on the basis of the output signal of a current sensor 120 that is electrically connected in series to the positive side of the battery module portion, and on the basis of the output signal of a voltage sensor 130 that is electrically connected in parallel between the positive and negative electrodes of the battery module portion.

The voltage sensor 130 comprises: a DC-AC inverter that is connected between the positive terminal 600 and the negative terminal 610 of the battery module portion, and that inverts the total voltage of the overall battery module portion into AC; a transformer for insulating the high voltage of the battery module portion; a voltage divider resistor that divides the voltage of the output side of the transformer; a DC-AC inverter that inverts from the AC voltage divided by the voltage divider resistor into DC voltage; a differential amplifier, consisting of an op-amp and a resistor, for determining the DC voltage converted by the AC-DC inverter; an A/D converter that converts the analog voltage outputted from the differential amplifier into a digital voltage, and so on; and the output terminal of the A/D converter is connected to the master battery control device 100. Accordingly, the master battery control device 100 is able to input the total voltage of the overall battery module portion as a digital value.

The current sensor 120 comprises: a Hall element; an op-amp that amplifies the current detection signal outputted from the Hall element; an A/D converter that converts the analog voltage outputted from the op-amp into a digital voltage, and so on; and the output terminal of the A/D converter is connected to the master battery control device 100. Accordingly, the master battery control device 100 is able to input the charge/discharge current of the overall battery module portion as a digital value. It should be understood that, instead of a Hall element, this current sensor 120 may incorporate a shunt resistor and an A/D converter that converts the analog voltage outputted from this shunt resistor to a digital voltage, with the output terminal of the A/D converter being connected to the master battery control device 100.

As previously described, a signal outputted from an ignition key switch is inputted to the master battery control device 100. This signal outputted from the ignition key switch cues starting and stopping of the storage battery system 1000.

When the ignition key switch is turned to ON, in the master battery control device 100, the power supply circuit operates on the basis of the output signal from the ignition key switch, and drive voltage is supplied from the power supply circuit to the plurality of electronic circuit components. Due to this, the plurality of electronic circuit components operate, and the master battery control device 100 starts. When the master battery control device 100 starts, start signals are outputted in parallel from the master battery control device 100 to each of the local battery control devices 220, 320, 420, and 520. And, in each of the local battery control devices 220, 320, 420, and 520, a power supply circuit operates on the basis of this start signal, so that drive voltage is supplied from this power supply circuit to a plurality of electronic circuit components. Due to this these pluralities of electronic circuit components operate, so that each of the local battery control devices 220, 320, 420, and 520 starts.

When each of the local battery control devices 220, 320, 420, and 520 starts, a start signal is outputted from this local battery control device 220, 320, 420, and 520 to the corresponding cell control device 230, 330, 430, and 530. In these cell control devices 230, 330, 430, and 530, power supply circuits of a plurality of integrated circuits operate sequentially on the basis of these start commands. Due to this, the pluralities of integrated circuits start, and the cell control devices 230, 330, 430, and 530 start. After the cell control devices 230, 330, 430, and 530 have started, predetermined initial processing is executed by each of the battery module sets 200, 300, 400, and 500, and thereby the starting of the storage battery system 1000 is completed. And completion report is outputted from the master battery control device 100 to the higher ranking control device.

As this predetermined initial processing, for example, there may be performed measurement of the voltages of the lithium battery cells, anomaly diagnostics, measurement of the overall voltages or currents of the assembled battery modules 210, 310, 410, and 510, measurement of their temperatures, calculation of the states of charge and/or the states of health of the assembled battery modules 210, 310, 410, and 510, and so on.

When the ignition key switch is turned to OFF, stop signals are outputted in parallel from the master battery control device 100 to each of the local battery control devices 220, 320, 420, and 520. And, when each of the local battery control devices 220, 320, 420, and 520 receives its stop signal, it outputs a stop signal to the corresponding cell control device 230, 330, 430, and 530. Due to this, predetermined ending processing is executed by each of the battery module sets 200, 300, 400, and 500. When this predetermined ending processing terminates, first, the power supply circuit for the integrated circuits of each of the cell control devices 230, 330, 430, and 530 goes to OFF. Due to this, the cell control devices 230, 330, 430, and 530 stop their operation. When these cell control devices 230, 330, 430, and 530 stop their operation and communication between the cell control devices 230, 330, 430, and 530 ceases to be possible, then the operation of the power supply circuits of the local battery control devices 220, 320, 420, and 520 stops, and the operations of their pluralities of electronic circuit components stop. Due to this, the operation of each of the local battery control devices 220, 320, 420, and 520 stops. When these local battery control devices 220, 320, 420, and 520 stop their operation, and communication between the local battery control devices 220, 320, 420, and 520 ceases to be possible, then the operation of the power supply circuit of the master battery control device 100 stops, and the operations of its plurality of electronic circuit components stop. Due to this, the master battery control device 100 stops, and the storage battery system 1000 stops.

As this predetermined ending processing, for example, measurement of the voltage of each of the lithium battery cells, regulation of the state of charge of each of the lithium battery cells, and so on may be cited.

Information transmission between the master battery control device 100 and the higher ranking control device such as the motor control device 11 or the like, and information transmission between the master battery control device and the various local battery control devices 220, 320, 420, and 520, utilize communication via an onboard local area network. LIN (Local Interconnect Network) communication is used for information transmission between the local battery control devices 220, 320, 420, and 520 and the corresponding cell control devices 230, 330, 430, and 530.

Electrical continuity or discontinuity of the first and second positive side main contactors 800 and 801 and of the first and second negative side main contactors 810 and 811 is controlled by the master battery control device 100, upon receipt of a command signal outputted from the motor control device 11. When the onboard electrical system starts, by receiving a notification of completion of starting of the storage battery system 1000 from the master battery control device 100, the motor control device 11 outputs a command signal for continuity of the first and second positive side main contactors 800 and 801 and of the first and second negative side main contactors 810 and 811 to the master battery control device 100. And, on the basis of this command signal, the master battery control device 100 outputs drive signals to the operating power supplies of the first and second positive side main contactors 800 and 801 and of the first and second negative side main contactors 810 and 811, and thus performs control so that the first and second positive side main contactors 800 and 801 and the first and second negative side main contactors 810 and 811 become continuous. Moreover, upon receipt of an OFF output signal from the ignition key switch when the onboard electrical system is to be stopped, or upon receipt of an anomaly signal when an anomaly has taken place in the onboard electrical system, the motor control device 11 outputs a command signal for discontinuity of the first and second positive side main contactors 800 and 801 and of the first and second negative side main contactors 810 and 811 to the master battery control device 100. And, on the basis of this command signal, the master battery control device 100 outputs drive signals to the operating power supplies of the first and second positive side main contactors 800 and 801 and of the first and second negative side main contactors 810 and 811, and thus performs control so that the first and second positive side main contactors 800 and 801 and the first and second negative side main contactors 810 and 811 become discontinuous.

When the onboard electrical system is to be started, first, the first and second negative side main contactors 810 and 811 are turned ON. Next, the positive side main contactors 800 and 801 are turned on. Due to this, main current is supplied to the power module 14 from the battery module portion, via the positive side main contactors 800 and 801.

In the following, the information handled by the master battery control device 100, the local battery control device 220, 320, 420, and 520, and the cell control devices 230, 330, 430, and 530 is summarized.

The cell control devices 230, 330, 430, and 530 detect the voltages of the various lithium battery cells, and transmit information specifying these voltages that have been detected to the corresponding local battery control devices 220, 320, 420, and 520. Furthermore, when an anomaly has occurred in the internal circuitry of one of the lithium battery cells, or in their own circuitry, the cell control devices 230, 330, 430, and 530 transmit an anomaly flag and information specifying the details of the anomaly to the corresponding one of the local battery control devices 220, 320, 420, and 520.

The local battery control devices 220, 320, 420, and 520 take as input information the information specifying the voltages of the lithium battery cells transmitted from the corresponding cell control devices 230, 330, 430 and 530, the detected voltage values transmitted from the voltage sensors 260, 360, 460, and 560, the detected current values transmitted from the current sensors 250, 350, 450, and 550, and the detected temperature values transmitted from the plurality of temperature sensors 270, 370, 470, and 570 (that may, for example, be thermistors) provided internally to the assembled battery modules 210, 310, 410, and 510, and, on the basis of that input information and initial information relating to the lithium battery cells that has been stored in advance, calculate or determine the states of charge (SOC), the states of health (SOH), the permitted charge and discharge currents, the total voltages, the charge or discharge currents, the maximum and minimum values of temperature, and the maximum and minimum values of cell voltage of the corresponding assembled battery modules 210, 310, 410, and 510, and transfer information specifying those values to the master battery control device 100.

The master battery control device 100 takes as input information these states of charge (SOC), states of health (SOH), permitted charge and discharge currents, total voltages, charge or discharge currents, maximum and minimum values of temperature, and maximum and minimum values of cell voltage of the corresponding assembled battery modules 210, 310, 410, and 510, transmitted as information from the local battery control devices 220, 320, 420, and 520, and, on the basis of this input information, calculates the state of charge (SOC) of the battery module portion, its charge and discharge current rates or its allowable charge and discharge power or its allowable charge or discharge current, its temperatures, its lithium battery cell voltages, and its states of health (SOH), and transmits information specifying these values to the higher ranking control device.

Here, the state of charge (SOC) of the battery module portion is the average value of the states of charge (SOC) of the assembled battery modules 210, 310, 410, and 510, transmitted as information from the local battery control devices 220, 320, 420, and 520. The charge and discharge current rates or the allowable charge and discharge power or the allowable charge or discharge current is calculated on the basis of information specifying the allowable charge and discharge current, the maximum and minimum values of cell voltage, the calculated state of charge (SOC) of the battery module portion, and so on, transmitted as information from the local battery control devices 220, 320, 420, and 520. The temperatures of the battery module portion are the maximum value and the minimum value of the temperatures of the assembled battery modules 210, 310, 410, and 510, transmitted as information from the local battery control devices 220, 320, 420, and 520. The cell voltages of the battery module portion are the maximum value and the minimum value among the cell voltages of the assembled battery modules 210, 310, 410, and 510, transmitted as information from the local battery control devices 220, 320, 420, and 520. And the states of health (SOC) of the battery module portion are the maximum value and the minimum value among the states of health (SOC) of the assembled battery modules 210, 310, 410, and 510, transmitted as information from the local battery control devices 220, 320, 420, and 520.

Furthermore, if an anomaly has taken place with any one of the sensors of the battery module sets 300 through 500, the master battery control device 100 does not immediately stop the operation of the storage battery system 1000, but rather substitutes, as information from the sensors of this anomalous battery module set, information from the sensors of some other healthy battery module set that has an electrical correlation relationship with this anomalous battery module set, and continues the control described above, so that the function of the storage battery system 1000 as a power supply is not immediately lost. The details of this control method will be explained hereinafter, subsequent to description of the hardware structure of the storage battery system 1000.

<Structure of the Battery Module Set Control Device>

Figure 3:
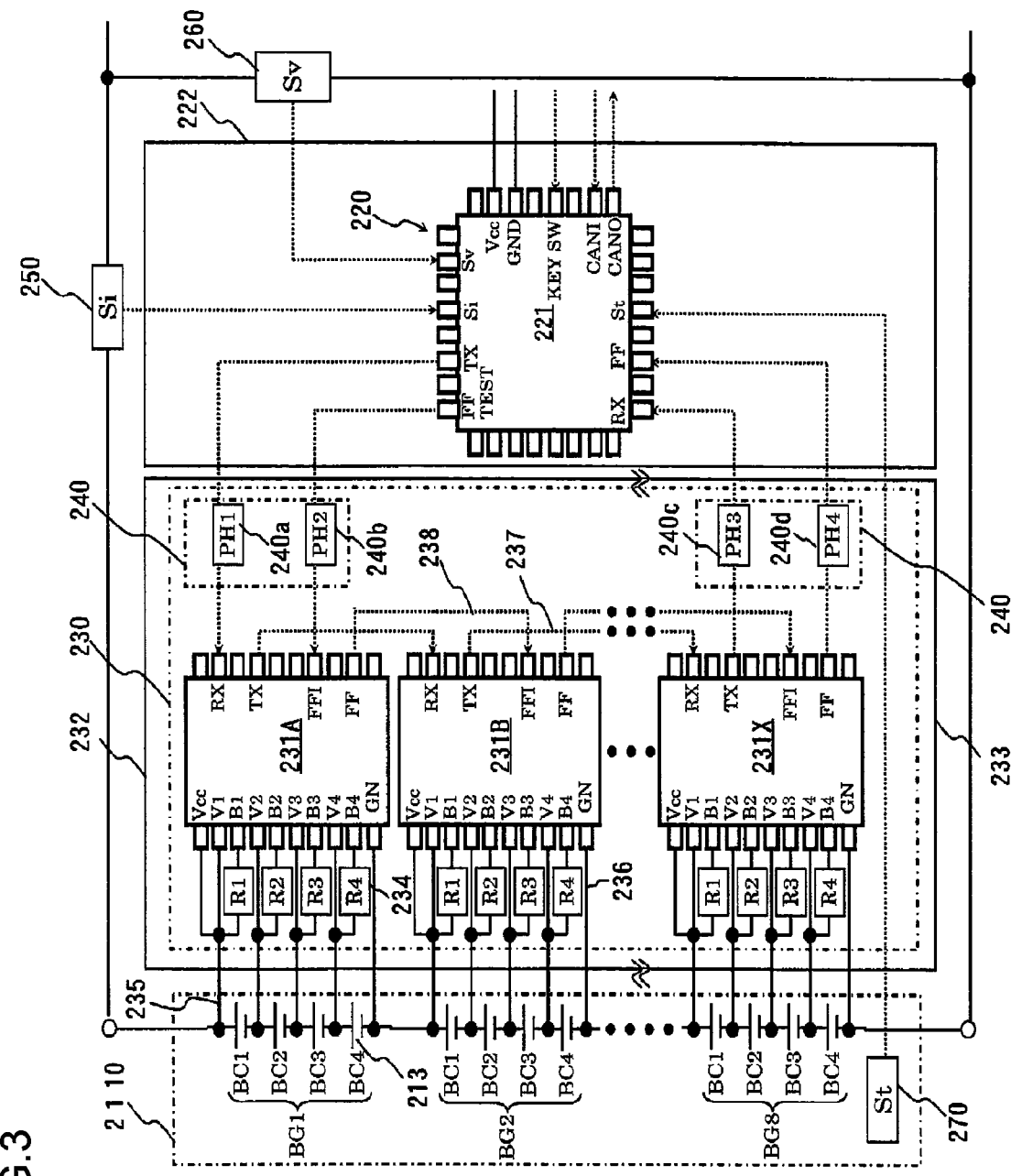
FIG. 3 is a circuit diagram showing the electrical connection structure of a control device for a set of battery modules.
Figure 4:
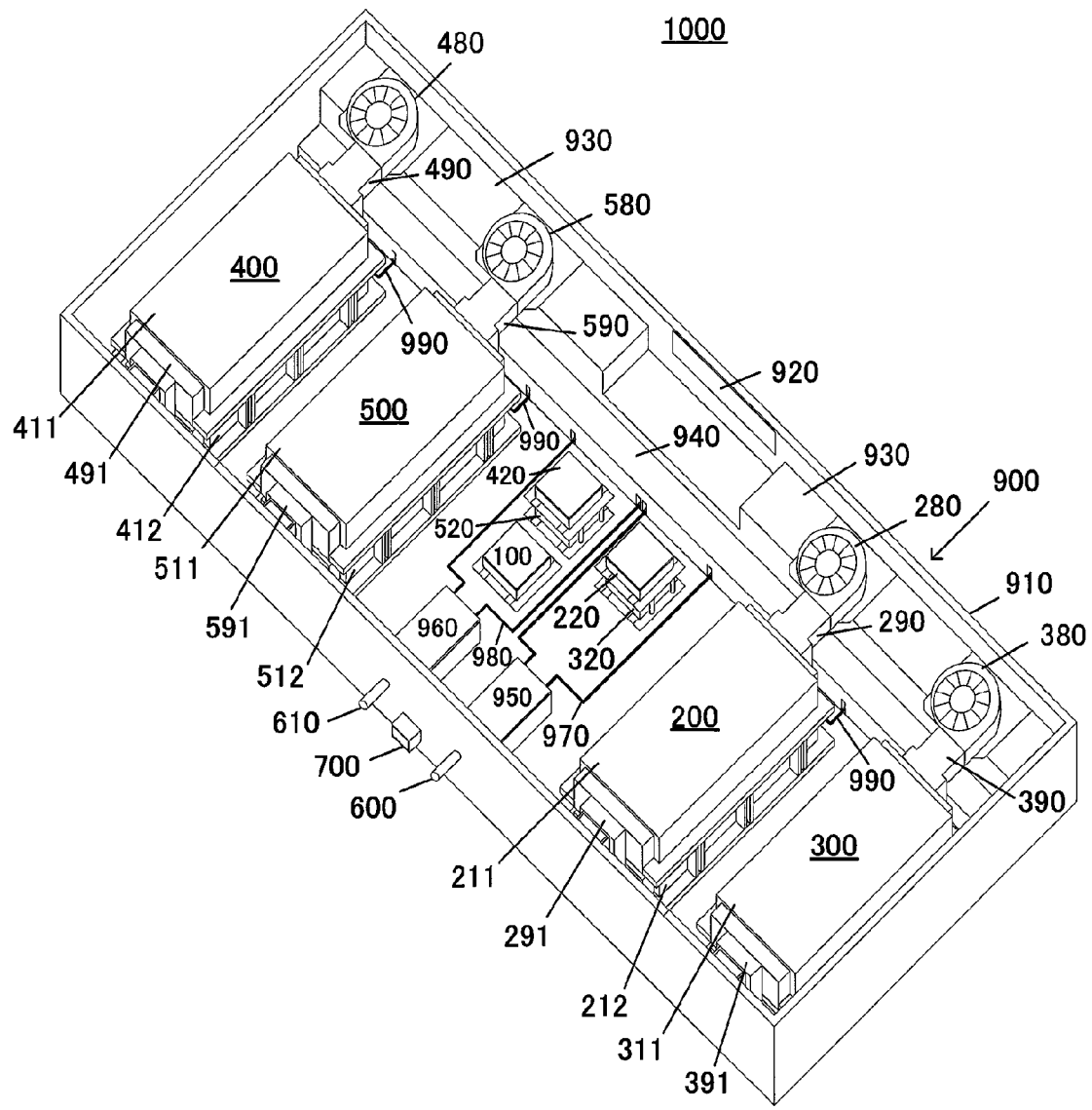
FIG. 4 is a perspective view showing the overall structure of an actual storage battery system.

Next, the battery module set control device will be explained with reference to FIG. 3.

In this battery module set control device, the local battery control device 220 includes a plurality of electronic circuit components that include a microcomputer 221. These electronic circuit components are mounted upon a circuit substrate, and are housed in a chassis that is separate from that of the corresponding assembled battery module 210. The chassis in which this local battery control device 220 is housed is disposed in the neighborhood of the corresponding assembled battery module 210, as an electronic circuit for controlling that module 210.

The cell control device 230 includes a plurality of electronic components, and these include 24 integrated circuits (ICs) 23A through 231X, electrically connected to the lithium battery cells 213. These electronic circuit components are mounted upon circuit substrates 232 and 233, that are divided so as to correspond to the high potential side assembled battery block 211 and the low potential side assembled battery block 212. These circuit substrates 232 and 233 are housed in chassis of the corresponding high potential side assembled battery block 211 and the low potential side assembled battery block 212, and are disposed at end portions of these chassis at the one ends thereof in the longitudinal direction.

Furthermore, the cell control device 230 includes a plurality of circuit elements such as a plurality of resistors 234 and a plurality of photo-couplers 240 and so on. The resistors 234 are current dissipation elements that are used when regulating the amounts of charge in the lithium battery cells 213, and that dissipates currents flowing out of the lithium battery cells 213 by converting them into heat, and four of these resistors (R1 through R4) are provided for each of the integrated circuits 231A through 231X. And the photo-couplers 240 are interface circuit elements that are provided upon the signal transmission path between the microcomputer 221 and the integrated circuit 231A, that is the first one of the integrated circuits 231A through 231X, and upon the signal transmission path between the microcomputer 221 and the integrated circuit 231X, that is the last one of the integrated circuits 231A through 231X, thus being insulation elements that optically transmit and receive signals at different electrical potential levels between these integrated circuits 231A and 231X, and the microcomputer 221.

The plurality of lithium battery cells 213 are divided into a plurality of groups that correspond to the integrated circuits 231A through 231X. In this embodiment, the 96 lithium battery cells 213 that correspond to the 48 lithium battery cells 213 constituting the assembled battery for the high potential side assembled battery block 211 and the 48 lithium battery cells 213 constituting the assembled battery for the low potential side assembled battery block 212 are allotted between 24 groups. In concrete terms, the 96 lithium battery cells 213 that are electrically connected in series are divided up four at a time, according to the order in which they are connected, in order from those at higher level of electrical potential, so as to constitute 24 groups. In other words, the 96 lithium cells 213 are divided up into groups so that: the group of lithium battery cells that are electrically connected in series from the 1st lithium battery cell 213 in order of electrical potential through the 4th lithium battery cell 213 in order of electrical potential constitute a first group; the group of lithium battery cells that are electrically connected in series from the 5th lithium battery cell 213 in order of electrical potential through the 8th lithium battery cell 213 in order of electrical potential constitute a second group; . . . the group of lithium battery cells that are electrically connected in series from the 89th lithium battery cell 213 in order of electrical potential through the 92nd lithium battery cell 213 in order of electrical potential constitute a twenty-third group; and the group of lithium battery cells that are electrically connected in series from the 93rd lithium battery cell 213 in order of electrical potential through the 96th lithium battery cell 213 in order of electrical potential constitute a twenty-fourth group.

It should be understood that while, in this embodiment, as an example, a case is cited and explained in which the plurality of lithium battery cells 213 are divided up into twelve groups for each of the two battery blocks, as an alternative method of dividing into groups, it would also be acceptable to divide up the 96 lithium battery cells 213 six at a time, into sixteen groups.

The positive sides and the negative sides of each of the four lithium battery cells 213 (BC1 through BC4) that constitute the first group are electrically connected via connection lines 235 and substrate wiring 236 to the integrated circuit 231A. Due to this, analog signals are read in to the integrated circuit 231A via the connection lines 235 and the substrate wiring 236, based upon the respective terminal voltages of these four lithium battery cells 213 that constitute the first group. The integrated circuit 213A includes an analog-digital converter, and these analog signal that are read in are sequentially converted to digital signals, so that the terminal voltages of the four lithium battery cells 213 that constitute the first group are detected. And, in a similar manner to the case of the integrated circuit 231A, the other integrated circuits 231B through 231X are electrically connected via the connection lines 235 and the substrate wiring 236, to the positive sides and the negative sides of each of the four ones of the lithium battery cells 213 that constitute the corresponding groups, so that each of the circuits reads in and detects the terminal voltages of those four lithium battery cells 213 that constitute the corresponding group.

Via the connection lines 235 and the substrate wining 236, bypass series circuits, in which resistors 234 (R1 through R4) and semiconductor switching elements provided internally to the integrated circuit 231A are connected in series, are electrically connected in parallel between the positive sides and the negative sides (i.e. between the terminals) of each of the four lithium cells 213 that constitute the first group. For the other groups as well, in a similar manner to the case with the first group, bypass series circuits are electrically connected in parallel between the positive sides and the negative sides of the four lithium cells 213 that constitute those groups.

On the basis of a state of charge regulation command outputted from the local battery control device 220, the integrated circuit 231A makes its semiconductor switching elements separately continuous for predetermined time periods, so that the bypass series circuits are separately electrically connected in parallel between the positive sides and the negative sides of the four lithium battery cells 231 that constitute the first group. Due to this, the lithium battery cells 213 to which the bypass series circuits are electrically connected in parallel are electrically discharged, so that their states of charge (SOC) are regulated. And, in a similar manner to the case with the first integrated circuit 231A, the other integrated circuits 231B through 231X as well control the semiconductor switching elements of their bypass series circuits that are connected in parallel with the sets of four ones of the lithium battery cells 213 that constitute the corresponding groups separately to be continuous for predetermined time periods, so that the states of charge SOC of those sets of lithium battery cells 213 that constitute those corresponding groups are individually regulated.

As described above, by individually controlling the continuity of the semiconductor switching elements of the bypass series circuits that are electrically connected in parallel with the sets of four lithium battery cells constituting the corresponding groups with the integrated circuits 231A through 231X, and by thus regulating the states of charge SOC of the four lithium battery cells 213 that constitute each group individually, it is possible to make the states of charge SOC of the lithium battery cells 213 in the entire group uniform, so that it is possible to prevent excess charging of the lithium battery cells 213 and the like.

The integrated circuits 231A through 231X detect any anomalous states of the sets of four lithium battery cells 213 that constitute the corresponding groups. An anomalous state can be excess charge or excess discharge. Excess charge and excess discharge are detected by the integrated circuits 231A through 231X comparing together the detected value of the terminal voltages of the four lithium battery cells 213 that make up the corresponding group, and both of an excess charge threshold value and an excess discharge threshold value. Excess charge is determined upon when the detected value of the terminal voltage exceeds the excess charge threshold value, while excess discharge is determined upon when the detected value of the terminal voltage is lower than the excess discharge threshold value. Furthermore, the integrated circuits 231A through 231X perform self-diagnosis for anomalies of their own internal circuitry, for example anomaly of a semiconductor switching element that is used for regulating the state of charge, temperature anomaly, and the like.

In this way, by means of the same internal circuitry, it is arranged for all the integrated circuits 231A through 231X to have the same functions of detecting the terminal voltages of the four lithium battery cells 213 (BC1 through BC4) that make up the corresponding group, regulating their states of charge, detection of anomalous states, and performing anomaly diagnostics for their own internal circuitry.

On one side of each of the integrated circuits 231A through 231X, there are provided a plurality of terminals that are electrically connected to the side of the assembled battery module 210. This plurality of terminals includes a power supply terminal (Vcc), voltage terminals (V1 through V4 and GND), and bypass terminals (B1 through B4). Substrate wiring 236, that is electrically connected to the connection lines 235, is electrically connected to the voltage terminals (V1 through V4 and GND). The semiconductor switching element ends of resistors 234 are electrically connected to the bypass terminals (B1 through B4) via the substrate wiring 236. And the opposite ends of the resistors 234 to their semiconductor switching element ends are electrically connected via the substrate wiring 236 to the voltage terminals (V1 through V4). And the power supply terminal (Vcc) is electrically connected via the substrate wiring 236 to the voltage terminal V1 (i.e. to the voltage terminal that is electrically connected to the positive side of the lithium battery cell BC1 at the highest potential end).

The voltage terminals (V1 through V4 and GND) and the bypass terminals (B1 through B4) are arranged alternatingly according to the order of electrical potential of the lithium battery cells 213 to which they are electrically connected. Due to this, it is possible to build this circuit in which the integrated circuits 231A through 231X are electrically connected to the connection lines 235, in a simple manner.

The voltage terminal GND is electrically connected to the negative side of the lithium battery cell BC4 at the lowest voltage end, i.e. to the negative side of the one of the four lithium battery cells 213 making up the corresponding group that is at the lowest electrical potential. Due to this, each of the integrated circuits 231A through 231X is able to operate by taking the minimum electrical potential of its corresponding group as a reference electrical potential. Since, in this manner, the reference electrical potentials of the integrated circuits 231A through 231X are different, therefore it is possible to reduce the voltage differences that are applied to each of the integrated circuits 231A through 231X from the assembled battery module 210, and accordingly it is possible to make the withstand voltages of the integrated circuits 231A through 231X smaller, so that it is possible to enhance the security and the reliability yet further.

The power supply terminal Vcc is electrically connected to the positive side of the lithium battery cell BC1, that is the one of the four lithium battery cells 213 making up the corresponding group that is at the highest electrical potential. Due to this, each of the integrated circuits 231A through 231X generates a voltage (for example 5V) for operating its internal circuitry, from the highest level voltage of its corresponding group. Since, in this manner, the operating voltages of the internal circuitry of the integrated circuits 231A through 231X are generated from the highest voltages of the corresponding groups, accordingly it is possible to equalize the power consumed from the four lithium battery cells 213 that make up the corresponding groups, so that it is possible to prevent imbalance of the states of charge SOC of the four lithium battery cells 213 that make up the corresponding groups.

A plurality of communication type terminals are provided at the opposite end of each of the integrated circuits 231A through 231X (i.e. at their opposite ends to those at which the voltage type terminals are provided). This plurality of terminals includes communication command signal transmit and receive terminals (TX and RX) for transmitting and receiving communication command signals, and anomaly signal transmit and receive terminals (FFO and FFI) for transmitting and receiving anomaly signals and anomaly test signals.

The communication command signal transmit and receive terminals (TX and RX) of the integrated circuits 231A through 231X are electrically connected in series in a non-insulated state in order of electrical potential of the corresponding groups. In other words, the communication command signal transmit terminals of these integrated circuits 231A through 231X are electrically connected to the communication command signal receive terminals in the following manner: the communication command signal transmit terminal (TX) of the integrated circuit 231A (i.e. of that integrated circuit at the highest electrical potential) is electrically connected in series in a non-insulated state to the communication command signal receive terminal (RX) of the integrated circuit 231B (i.e. of the integrated circuit at the next lower electrical potential); the communication command signal transmit terminal (TX) of this integrated circuit 231B is electrically connected in series in a non-insulated state to the communication command signal receive terminal (RX) of the integrated circuit 231C; . . . the communication command signal transmit terminal (TX) of this integrated circuit 231W is electrically connected in series in a non-insulated state to the communication command signal receive terminal (RX) of the integrated circuit 231X. The type of connection method employed in this embodiment is termed the "daisy-chain" connection method.

The anomaly signal transmit and receive terminals (FFO, FFI) of the integrated circuits 231A through 231X have a similar connection relationship, and are connected in series in an electrically non-isolated manner according to the order of the electrical potential of the corresponding groups. In other words, the anomaly signal transmit terminal (FFO) of an integrated circuit at a certain electrical potential level is connected in series in an electrically non-isolated manner to the anomaly signal receive terminal (FFI) of the integrated circuit that is at the next lower potential level down from that integrated circuit at that certain electrical potential level.

The light reception side of a photo-coupler 240a (PH1) is electrically connected to the communication command signal receive terminal (RX) of the integrated circuit 231A corresponding to the group of a plurality of lithium battery cells 213 that is at the highest electrical potential. And the communication command signal transmit terminal (TX) of the microcomputer 221 is electrically connected to the light emission side of this photocoupler 240a. Moreover, the light emission side of a photo-coupler 240c (PH3) is electrically connected to the communication command signal transmit terminal (TX) of the integrated circuit 231X corresponding to the group of a plurality of lithium battery cells 213 that is at the lowest electrical potential. And the communication command signal receive terminal (RX) of the microcomputer 221 is electrically connected to the light reception side of this photo-coupler 240c. Due to these connections, along with electrical insulation being provided between the cell control device 230 and the local battery control device 220, a communication command signal loop transmission path 237 is formed from the microcomputer 221 to the photo-coupler 240a, then to the integrated circuit 231A, ... then to the integrated circuit 231X, then to the photo-coupler 240c back to the microcomputer 221, in that order. This loop transmission path 237 is a serial transmission path.

The communication command signals outputted from the microcomputer 221 are transmitted to this communication command signal loop transmission path 237. A communication command signal is a signal consisting of a plurality of bytes, in which are provided a plurality of regions such as data regions specifying the details of this communication (i.e. of this control) and so on, and these communication command signals are transmitted in a loop manner according to the above described order of transmission.

These communication command signals that are outputted from the microcomputer 221 to the integrated circuits 231A through 231X via the communication command signal loop transmission path 237 include: request signals for requesting the detected terminal voltages of the lithium battery cells 213; command signals for regulating the state of charge of the lithium battery cells 213; start signals for bringing the integrated circuits 231A through 231X from the sleep state to the wake-up state, in other words for starting the operation of these circuits; stop signals for putting the integrated circuits 231A through 231X into the sleep state from the wake-up state, in other words for stopping the operation of these circuits; address setting signals for setting addresses for communication by the integrated circuits 231A through 231X; anomaly checking signals for checking anomalous states of the integrated circuits 231A through 231X; and so on.

It should be understood that while, in this embodiment, a case has been cited and described in which the communication command signals are transmitted from the integrated circuit 231A to the integrated circuit 231X, it would also be acceptable for them to be transmitted from the integrated circuit 231X along to the integrated circuit 231A.

Furthermore, the light reception side of a photo-coupler 240b (PH2) is electrically connected to the anomaly signal receive terminal (FFI) of the integrated circuit 231A corresponding to the group of a plurality of lithium battery cells 213 that is at the highest electrical potential. And an anomaly test signal transmit terminal (FFTEST) of the microcomputer 221 is electrically connected to the light emission side of this photocoupler 240b. Moreover, the light emission side of a photo-coupler 240d (PH4) is electrically connected to the anomaly signal transmit terminal (FFO) of the integrated circuit 231X corresponding to the group of a plurality of lithium battery cells 213 that is at the lowest electrical potential. And the anomaly signal receive terminal (FF) of the microcomputer 221 is electrically connected to the light reception side of this photo-coupler 240d. Due to these connections, along with electrical insulation being provided between the cell control device 230 and the local battery control device 220, an anomaly signal loop transmission path 238 is formed from the microcomputer 221 to the photo-coupler 240b, then to the integrated circuit 231A, ... then to the integrated circuit 231X, then to the photo-coupler 240d back to the microcomputer 221, in that order. This loop transmission path 238 is a serial transmission path.

The anomaly test signals outputted from the microcomputer 221 are transmitted to this anomaly signal loop transmission path 238. An anomaly test signal is a one bit Hi level signal that is transmitted for detecting an anomaly in the integrated circuits 231A through 231X or an anomaly such as an interruption in the communication circuitry or the like, and these anomaly test signals are transmitted in a loop manner according to the above described order of transmission. If there is an anomaly, then the anomaly test signal is returned to the microcomputer 221 as a Low level signal. Due to this, the microcomputer 221 is able to detect that there is an anomaly in the integrated circuits 231A through 231X, or an anomaly such as an interruption in the communication circuitry or the like. Moreover, if an anomaly has been detected by any one of the integrated circuits 231A through 231X, then a signal that indicates the anomaly is outputted to the anomaly signal loop transmission path 238 from the integrated circuit that has detected the anomaly, for example the integrated circuit 231C. The signal that indicates the anomaly is a 1-bit signal, and is transmitted from the integrated circuit in which the anomaly has occurred (supposed to be 231C) to the microcomputer 221 in the following order: integrated circuit 231D, ..., integrated circuit 231X, and photo-coupler 240d. Due to this, it is possible for a notification to be rapidly issued from the integrated circuit in which the anomaly has been detected to the microcomputer 221.

It should be understood that while, in this embodiment, a case has been cited and described in which the anomaly test signals are transmitted from the integrated circuit 231A along to the integrated circuit 231X, it would also be acceptable to arrange for them to be transmitted from the integrated circuit 231X along to the integrated circuit 231A. Moreover while, in this embodiment, a case has been cited and described in which the signal that describes the anomaly is transmitted from the integrated circuit that has detected the anomaly towards an integrated circuit that is at a lower level of electrical potential, it would also be acceptable to arrange for this signal to be transmitted from the integrated circuit that has detected the anomaly towards an integrated circuit that is at a higher level of electrical potential.

The photo-couplers 240a through 240d (PH1 through PH4) not only provide electrical insulation of the communication command signal loop transmission path 237 and the anomaly signal loop transmission path 238 between the cell control device 230 and the local battery control device 220, but also convert the signals transmitted and received between the cell control device 230 and the local battery control device 220, during their transmission, to optical signals. As described above, the respective power supply electrical potentials and the respective power supply voltages of the cell control device 230 and the local battery control device 220 are quite different. Due to this, if the cell control device 230 and the local battery control device 220 were to be electrically connected together and signal transmission were implemented between them directly, then it would become necessary to perform potential conversion and voltage conversion upon the transmitted signals, and this would increase the amount of interface circuitry between the cell control device 230 and the local battery control device 220 and also raise its price, so that it would become impossible to provide a compact control device at a cheap price. Thus, in this embodiment communication between the cell control device 230 and the local battery control device 220 is implemented using the photo-couplers 240a through 240d (PH1 through PH4), and thereby it becomes possible to make the control device more compact and to reduce its cost.

Furthermore, as previously described, the power supply electrical potentials also differ between the various integrated circuits 231A through 231X. However since, in this embodiment, the integrated circuits 231A through 231X are electrically connected in series according to the order of electrical potential of the corresponding groups of pluralities of the lithium battery cells 213, in other words since they are connected in a daisy chain manner, accordingly it is possible to implement signal transmission between the various integrated circuits 231A through 231X in a simple manner by electrical potential conversion (level shifting). On its signal reception side, each of the integrated circuits 231A through 231X includes an electrical potential conversion (level shifting) circuit. Thus since, in this embodiment, the signal transmission between the various integrated circuits 231A through 231X is implemented in this simple manner, rather by providing photo-couplers whose price is higher than that of other circuit elements, accordingly it is possible to provide a control device that is compact and moreover low in price.

The microcomputer 221 inputs signals of various types, and, along with transmitting the communication command signals previously described to the cell control device 230 on the basis of the input information obtained from these input signals, or on the basis of calculated information that has been calculated from this input information, also outputs signals to the higher ranking control device (the motor control device 11 or the vehicle control device 41).

The various types of signal that are inputted to the microcomputer 221 include: terminal voltage signals of the lithium battery cells 213 outputted from the integrated circuits 231A through 231X; an anomaly signal outputted from any one of the integrated circuits 231A through 231X that has detected an anomaly; a current sensor signal outputted from the current sensor 250 for detecting the charge/discharge current of the assembled battery module 210; a voltage sensor signal outputted from the voltage sensor 260 for detecting the total voltage of the assembled battery module 210, temperature sensor signals outputted from the temperature sensors (such as thermistor elements) 270, provided internally to the assembled battery module 210 for detecting the temperatures of the assembled batteries; an ON/OFF signal based upon the operation of the ignition key switch; signals outputted from a higher ranking control device (the motor control device 11 or the vehicle control device 41); and so on.

And the various types of signal that are outputted from the microcomputer 221 include: the previously described communication command signals; signals that provide information calculated on the basis of the state information of the assembled battery module 210 (such as, for example, its voltage, current, temperature, and so on) like, for example, the amount of power that can be charged into the assembled battery module 210 or discharged from it, its state of charge SOC, its state of health SOH, and so on; and signals that provide anomalous state information (such as excess charge, excess discharge, excess temperature, or the like) as determined from results or anomaly information calculated on the basis of the state information of the assembled battery module 210 (for example its voltage, current, temperature, and so on) and the like.

Among those output signals, the signals that provide information such as the amount of power that can be charged or discharged, the state of charge SOC, and the state of health SOH and so on, and the signals that provide anomalous state information (for example, excess charge, excess discharge, excess temperature and so on) are outputted to the higher ranking control device (the motor control device 11 or the vehicle control device 41).

<Hardware Structure of the Storage Battery System 1000>

Next, the actual construction of the storage battery system 1000 will be explained with reference to FIGS. 4 through 8. The storage battery system 1000 includes the four battery module sets 200, 300, 400, and 500, that are shaped as rectangular parallelepipeds and are contained in a casing 900, consisting of a lower casing member 910 and an upper lid (not shown in the figures). The casing 900 (the lower casing member 910) is a storage unit shaped as a rectangular parallelepiped. The battery module sets 200, 300, 400, and 500 are lined up in one row along the longitudinal direction of the casing 900, so that their longitudinal directions coincide with the direction transverse to the casing 900, and so that a certain open space is defined between them at the central portion of the casing 900 in the longitudinal direction. The battery module sets that are disposed at one side of this space at the central portion of the casing 900 in the longitudinal direction, are the battery module sets 200 and 300 that are included in the first battery module block (with the battery module set 200 positioned towards the center of the casing 900). And the battery module sets that are disposed at the other side of this space at the central portion of the casing 900 in the longitudinal direction, are the battery module sets 400 and 500 that are included in the second battery module block (with the battery module set 500 positioned towards the center).

An intake duct 930 is provided along one upper longitudinal edge of the casing 900 (the lower casing member 910), for inducting air from the exterior into the casing 900 as a cooling medium for the battery module sets 200, 300, 400, and 500. At a central portion of the longitudinal side wall of the casing 900 (the lower casing member 910), at a spot that corresponds to the open space provided at the central portion of the casing 900 in its longitudinal direction, an intake aperture (not shown in the figures) is provided for inducting this cooling air from the exterior into the intake duct 930. And at a central portion of the longitudinal side wall of the casing 900 (the lower casing member 910) (i.e. at a location that corresponds to the open space provided at the central portion of the casing 900 in its longitudinal direction), and moreover above the abovementioned intake aperture, an exhaust aperture 920 is provided for expelling cooling air that has finished cooling the battery module sets 200, 300, 400, and 500 from the interior of the casing 900 (the lower casing member 910) to the exterior.

At the central portion of the casing 900 (the lower casing member 910) in its longitudinal direction, in the open space described above, there are disposed the master battery control device 100, the local battery control devices 220, 320, 420, and 520 described below, a box 950 for the first and second positive side main contactors 800 and 801 and the first and second negative side main contactors 810 and 811 on the positive side, and a box 960 for the first and second positive side main contactors 800 and 801 and the first and second negative side main contactors 810 and 811 on the negative side. The local battery control devices 220, 320, 420, and 520 described below are disposed in an overlapped arrangement at one end in the transverse direction of the center space in the casing 900 (the lower casing member 910). In concrete terms, the local battery control devices 220 and 320 are arranged towards the side of the battery module set 200 as an overlapped lower layer and upper layer, while the local battery control devices 420 and 520 are arranged towards the side of the battery module set 500 in a similar manner as an overlapped lower layer and upper layer. The box 950 for the first and second positive side main contactors 800 and 801 and the first and second negative side main contactors 810 and 811 on the positive side, and the box 960 for the first and second positive side main contactors 800 and 801 and the first and second negative side main contactors 810 and 811 on the negative side, are arranged side by side in the longitudinal direction of the casing 900 (the lower casing member 910), at the other end portion in the transverse direction of the casing 900 (the lower casing member 910). And the master battery control device 100 is disposed between the box 960 for the first and second positive side main contactors 800 and 801 and the first and second negative side main contactors 810 and 811 on the negative side, and the local battery control devices 420 and 520. In this manner, in this embodiment, along the transverse direction of the casing 900 (the lower casing member 910), in the center space of the casing 900 (the lower casing member 910), the various units are arranged so that the box 950 for the first and second positive side main contactors 800 and 801 and the first and second negative side main contactors 810 and 811 on the positive side, and the overlapped local battery control devices 220 and 320, form one row of units, while the box 960 for the first and second positive side main contactors 800 and 801 and the first and second negative side main contactors 810 and 811 on the negative side, the master battery control device 100, and the overlapped local battery control devices 420 and 520 form another row of units.

A wiring duct 940 is provided between the intake duct 930 and the battery module sets 200, 300, 400, and 500. A plurality of terminal portions are provided in the interior of this wiring duct 940. To these plural terminal portions, there are electrically connected: positive side high current cables 970 and negative side high current cables 980 that extend through the interior of the wiring duct 940 from the box 950 for the first and second positive side main contactors 800 and 801 and the first and second negative side main contactors 810 and 811 on the positive side, and from the box 960 for the first and second positive side main contactors 800 and 801 and the first and second negative side main contactors 810 and 811 on the negative side; and positive side and negative side connection cables 990 that extend through the interior of the wiring duct 940 from the assembled battery modules 210, 310, 410, and 510. The electric circuit shown in FIG. 2 is constituted in this manner.

In the box 950 for the first and second positive side main contactors 800 and 801 and the first and second negative side main contactors 810 and 811 on the positive side, the positive side high current cable 970 that is electrically connected to the positive side of the first battery module block (the one in which the battery module sets 200 and 300 are electrically connected in series) is electrically connected to the positive terminal 600 via the first positive side main contactor 800; and the positive side high current cable 970 that is electrically connected to the positive side of the second battery module block (the one in which the battery module sets 400 and 500 are electrically connected in series) is also electrically connected to the positive terminal 600 via the second positive side main contactor 801. Due to this, the positive sides of the first and second battery module blocks are electrically connected together in parallel.

And, in the box 960 for the first and second positive side main contactors 800 and 801 and the first and second negative side main contactors 810 and 811 on the negative side, the negative side high current cable 980 that is electrically connected to the negative side of the first battery module block (the one in which the battery module sets 200 and 300 are electrically connected in series) is electrically connected to the negative terminal 610 via the first negative side main contactor 810; and the negative side high current cable 980 that is electrically connected to the negative side of the second battery module block (the one in which the battery module sets 400 and 500 are electrically connected in series) is also electrically connected to the negative terminal 610 via the second negative side main contactor 811. Due to this, the negative sides of the first and second battery module blocks are electrically connected together in parallel.

The positive terminal 600 is provided upon the side wall of the casing 900 (the lower casing member 910), at the above described other end thereof in its transverse direction, at a spot that corresponds to the box 950 for the first and second positive side main contactors 800 and 801 and the first and second negative side main contactors 810 and 811 on the positive side, and extends towards the outward direction. And the negative terminal 610 is provided upon the side wall of the casing 900 (the lower casing member 910), at the above described other end thereof in its transverse direction, at a spot that corresponds to the box 960 for the first and second positive side main contactors 800 and 801 and the first and second negative side main contactors 810 and 811 on the negative side, and also extends towards the outward direction. The positive terminal 600 and the negative terminal 610 are arranged upon the casing 900 parallel to one another, and at the same height. A connector 700 for external communication is provided between the positive terminal 600 and the negative terminal 610. And the connector of a CAN communication cable is connected to this connector 700. Due to this, information can be transmitted between the master battery control device 100, and the motor control device 11 and the vehicle control device 41.

Taking the battery module set 200 as a representative, its assembled battery module 210 is made as an integrated structure in which two battery blocks, the high potential side assembled battery block 211 and the low potential side assembled battery block 212, are mounted one above the other. In this embodiment, the high potential side assembled battery block 211 is the upper one and the low potential side assembled battery block 212 is the lower one, but they might be the other way around without any problem.

Figure 5:
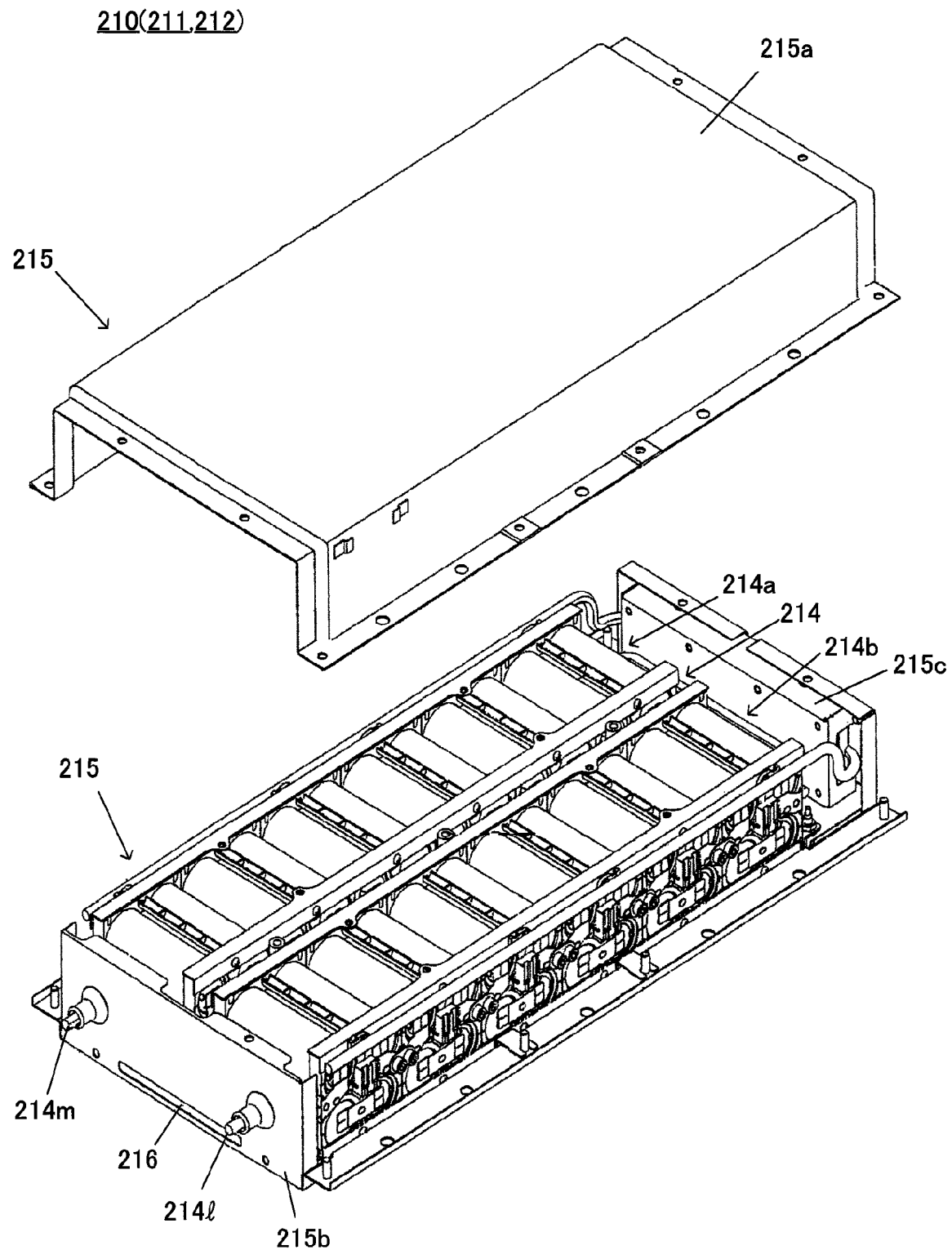
FIG. 5 is a perspective view showing the internal structure of one assembled battery module.

Referring now to FIG. 5, the assembled battery block 211 is built with its assembled battery 214, in which 48 lithium battery cells 213 are electrically connected in series, being held within a module case 215 (a chassis that consists of a lower container 215b and an upper lid 215a). The module case 215 is a storage box having the shape of a rectangular parallelepiped.

A single intake side vent duct 290 (refer to FIG. 4) for both of the two assembled battery blocks 211 and 212 is attached to the battery module set 200 (in which the assembled battery modules 210 are stacked) at its one end portion in its longitudinal direction. A single fan unit 280 is connected to the upstream end portion of this intake side vent duct 290. And a single exhaust side vent duct 291 for both of the two-assembled battery blocks 211 and 212 is attached at the other end portion in the longitudinal direction of the battery module set 200 (in which the assembled battery modules 210 are stacked). While, in this embodiment, the single fan unit 280 (for intake) is provided to the battery module set 200, it would also be acceptable also to provide an exhaust side fan unit in the exhaust side vent duct 291. Moreover while, in this embodiment, a fan unit and fan ducts are provided to each of the battery module sets 200, 300, 400, and 510, it would also be acceptable to provide a fan unit and fan ducts to each of the assembled battery modules 210, 310, 410, and 510.

Figure 6:
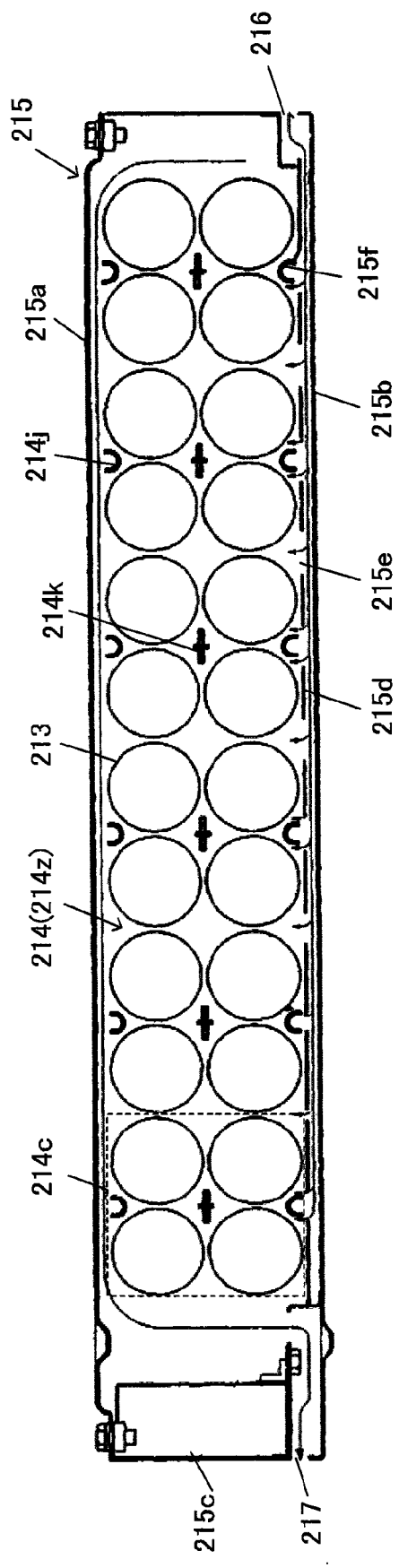
FIG. 6 is a sectional view showing the cross sectional structure of the assembled battery module of FIG. 5 in the transverse direction regarding the lithium battery cells.

Referring now to FIG. 6, an air intake slot 216 is provided at the lower portion of the side wall of the module case at one end thereof in its longitudinal direction. And an exhaust aperture 217 (refer to FIG. 6) is provided at the lower portion of the side wall of the module case at the other end thereof in its longitudinal direction. A reinforcing louver 215d is provided between the bottom surface of the module case 215 (the lower container 215b) and the assembled battery 214. This reinforcement louver 215d is an element between the bottom surface of the module case 215 (the lower container 215b) and the assembled battery 214, for defining ducts for conducting cooling air inducted into the interior of the module case 215 in between the lithium battery cells 213 of the assembled battery 214, and this louver 214d is provided with through intake apertures 215e at positions that correspond to the lithium battery cells 213. The louver 215d is formed so that the areas of these intake apertures 215e become smaller in progression from the air intake slot 216 towards the exhaust aperture 217, i.e. so that the aperture area of the intake aperture 215 closest to the exhaust aperture 217 is the smallest. A shield louver member 215f is provided to the intake aperture 215e that is positioned closest to the air intake slot 216.

The assembled battery 214 is built from two assembled battery units (second sub-assembly units) 214a and 214b. Each of these two assembled battery units (second sub-assembly units) 214a and 214b is built from six assembled batteries (first sub-assembly units) 214c (refer to FIG. 7).

Figure 8:
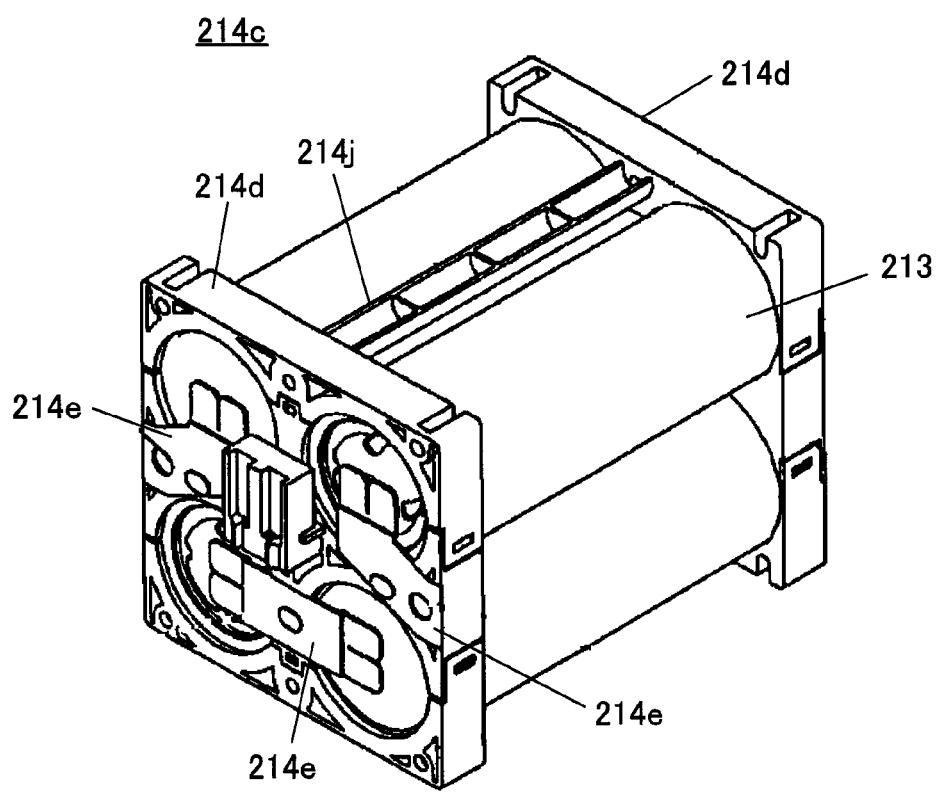
FIG. 8 is a perspective view of a assembled battery included in the assembled battery unit of FIG. 7.

Each assembled battery (first sub-assembly unit) 214c is an assembly of four cylinder shaped or circular post shaped lithium battery cells 213, into a single group (refer to FIG. 8). These four lithium battery cells 213 are arranged so that their central axes are parallel in two groups of two, upon two levels, i.e. one to the upper left, one to the upper right, one to the lower left, and one to the lower right, i.e. so that their circumferential surfaces oppose one another, with their positive terminals and negative terminals (i.e. their top surfaces and bottom surfaces) facing in opposite directions alternately, and, from both their ends in their axial directions, they are held between holders 214d made from synthetic resin of high insulating quality. The polarities of the terminals facing each of the holders 214d of the pair of lithium battery cells 213 adjacent to one another on each of the four sides of the assembly are opposite. By the circumferential surfaces of the lithium battery cells 213 being arranged so as to face one another in this manner, it is possible to build the assembled batteries 214c to be compact. Moreover, since the external terminals of the four lithium battery cells 213 (i.e. their positive and negative terminals) are arranged in a regular manner along the same direction, accordingly, in addition to enhancing the ease of manufacture, also it is possible to maintain the security of the structure, and this is also satisfactory from the point of view of maintenance. Furthermore, the resistance to vibration in the vehicle mounted state is enhanced, and the resistance to mechanical shock in the event of the vehicle becoming involved in a traffic accident is also satisfactory.

Bus bars 214e made from copper, that are electrically conductive connection members, are attached by welding to the terminal faces of the four lithium cells 213 that are exposed from the holder 214d, so that the four lithium battery cells 213 are electrically connected in series. The direction in which the lithium battery cells 213 in one holder 214d are electrically connected by their bus bars 214e, and the direction in which the lithium battery cells 213 in the other holder 214d are electrically connected by their bus bars 214e are different. At the other holder 214d, the upper and lower adjacent lithium battery cells 213 are electrically connected together by the bus bars 214e. However, at the one holder 214d, the two lower adjacent lithium battery cells 213 are electrically connected together by one of the bus bars 214e, while each of the upper lithium battery cells 213 is electrically connected to a lithium battery cell 213 of the next adjacent assembled battery 214c by another of the bus bars 214e. Due to this, the bus bar 214e that joins together these two lithium battery cells 213 has a shape that is different from that of the other bus bar 214e: at the side edge portion of the holder 214d, the structure makes it possible to connect to the bus bar 214e that joins to a lithium battery cell 213 of the adjacent other assembled battery 214c via an electrically conductive link member 214f (see FIG. 7). This bus bar 214e is embedded in the holder 214d by insert molding.

A temperature sensor 270 is adhered to the four lithium cells 213 of a specified assembled battery 214c that is determined in advance (in this embodiment, the assembled battery 214c nearest to the exhaust aperture 217), and temperature detection wires are extended from this temperature sensor 270. Furthermore, voltage detection lines 235 are extended from each of the assembled batteries 214c.

The lithium battery cells 213 are ones that use lithium manganese complex oxide as their positive electrode active material and amorphous carbon as their negative electrode active material, and their nominal output voltage is 3.6 V and their capacity is 5.5 Ah. It should be understood that the terminal voltage of the lithium battery cells 213 changes when their state of charge changes. When the amount of charge has dropped, the terminal voltage of the lithium battery cells 213 drops down as low as 2.5 volts, whereas when the amount of charge has increased, the terminal voltage of the lithium cells rises as high as 4.3 volts.

Gaps are defined between the adjacent left and right lithium battery cells 213 and upper and lower locations on the holder 214d, and arc shaped louvers 214j are provided in these gaps for conducting cooling air currents to the circumferential surfaces around the outsides of the lithium battery cells 213. Furthermore, along with a gap being defined at the center between the four lithium cells that are centered in the holder 214d and the holder 214d, also a cross shaped louver 214k having a cruciform cross sectional shape is disposed therein for conducting a cooling air current to the circumferential surfaces of the lithium battery cells 213, of which surfaces facing to each other.

Figure 7:
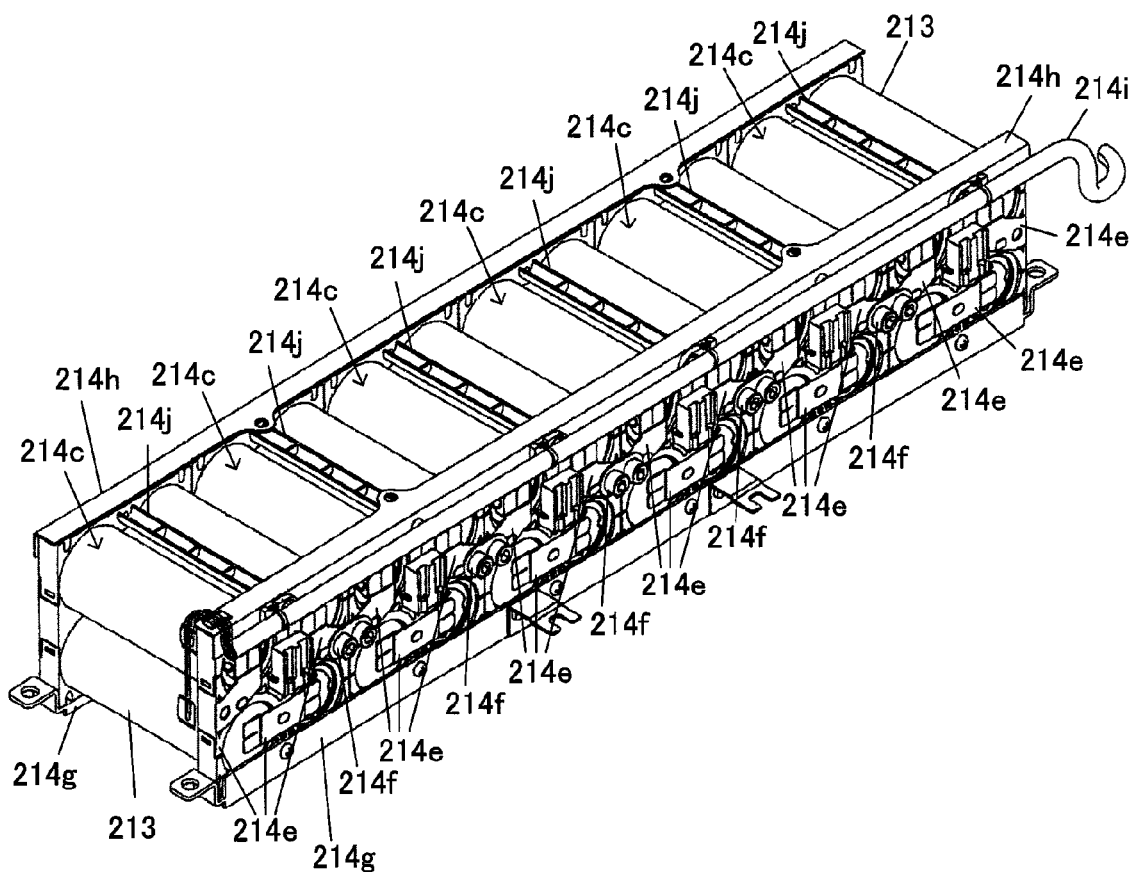
FIG. 7 is a perspective view of a assembled battery unit included in the assembled battery module of FIG. 5.

Each of the two assembled battery units (second sub-assembly units) 214a and 214b includes six assembled batteries 214c (refer to FIG. 7). These six assembled batteries 214c are arranged in one row, with the central axes of all of their lithium battery cells 213 parallel; or to put it in another manner, so that the outer circumferential surfaces of the lithium cells oppose one another. This block of the six assembled batteries 214c is fixed at its two lower edge portions by two elongated channel shaped block bases 214g having approximate letter-h cross-sectional shapes and arranged so as to confront one another, and is fixed at its two upper edge portions by two elongated channel shaped block reinforcement plates 214h having approximate letter-L cross-sectional shapes and arranged so as to confront one another. Furthermore, the bus bars 214e of adjacent ones of the assembled batteries 214c are linked together via link members 214f. Since, in this embodiment, the construction is such that the assembled batteries 214c are fixed to the parallel block bases 214g, accordingly the ease of assembly and convenience of service are enhanced. Moreover, in this embodiment, since the block structure consisting of the assembly of the assembled batteries 214c is fixed by the block reinforcement plates 214h, accordingly this block structure of the assembled batteries 214c is reinforced. Yet further, in this embodiment, the productivity during production of the assembled battery 214 is enhanced, and it becomes possible to establish a constructional and dimensional relationship in common with assembled batteries for other power supply systems, and moreover checking of the battery cells for product quality management and maintenance after production are also both excellent.

A harness group 214i is fixed along the edge of one of the block reinforcement plates 214h, and includes voltage detection lines for detecting the voltages of the lithium battery cells 213 and a temperature detection line extending from the temperature sensor 270, bundled together by cable ties or the like. Since, in this embodiment, the harness group 214i is bundled together and fixed to the block reinforcement plate 214h, accordingly the mechanical strength in relation to vibration or shock or the like applied to the harness group 214i is excellent, and the ease of working for electrical connection is enhanced.

The two assembled battery units (second sub-assembly units) 214a and 214b are held as two-assembled battery rows that lie side by side across the transverse direction of the module case 215 (the lower container 215b) (refer to FIG. 5), so that the direction in which the assembled batteries 214c are arranged is the longitudinal direction of the module case 215 (the lower container 215b), and are electrically connected in series by assembled battery unit connection bus bars not shown in the figures.

A cell control device box 215c in which is housed the circuit substrate 232 upon which are mounted the electronic circuit components that make up the cell control device 230, such as the integrated circuits 231, the photo-couplers 240, the resistors 234 and so on, is disposed at one end of the module case 215 in the longitudinal direction, and is fixed there with screws or the like. One of the integrated circuits 231 corresponds to each of the assembled batteries 214c. The harness groups 214i of the two assembled battery units 214a and 214b extend to this cell control device box 215c. A connector provided at the end of one of the harness groups 214i is connected to a connector upon the circuit substrate 232 from one transverse direction of the module case 215. And a connector provided at the end of the other one of the harness groups 214i is connected to a connector upon the circuit substrate 232 from the other transverse direction of the module case 215.

A positive side high current cable 214i that is electrically connected to the positive side of the batter group 214, and a negative side high current cable 214m that is connected to the negative side of the assembled battery 214, extend out from the side wall of the module case at its other end in the longitudinal direction (i.e. from the opposite end to the one at which the cell control device box 215c is provided). The nominal output voltage of an assembled battery module 210 is 170 V, and its capacity is 5.5 Ah. It should be understood that, since the terminal voltages of the lithium secondary batteries vary according to their states of charge, accordingly the actual terminal voltage varies on the basis of the state of charge.

The lower level control device 220 decides whether it is necessary to perform cooling of the battery module set 200 from the temperature information detected on the basis of the plurality of temperature sensors 270 (for example, it may compare this temperature information with a temperature threshold value, and may decide that cooling is required when a detected temperature becomes greater than the temperature threshold value); and, when the lower level control device 220 has decided that cooling is required, it operates the fan unit 280. Due to this, air is sucked into the intake duct 930 as cooling are, and is blown into the intake side vent duct 290. This cooling air that has been drawn in is divided as it passes through the assembled battery module 210, and flows via the air intake slot 216 into the internal ducting in the lower portion of the module case 215, so as to flow towards the exhaust aperture 217. This cooling air that flows into the interior of the ducting then flows via the intake apertures 215e of the reinforcement louver 215d between the lithium battery cells 213 of the battery groups 214. And the cooling air that has thus flowed in between the lithium battery cells 213 of the assembled battery 214 flows from the lower portion of the interior of the module case 215 into its upper portion. At this time, the flow of the cooling air is controlled by the arch shaped louver 214j and the cross shaped louver 214k, so that it flows around the external circumferences of the lithium battery cells 213. Due to this, the assembled battery 214 (that includes 48 of the lithium battery cells 213) is cooled. After having thus performed cooling, this cooling air flows from the upper portion of the module case 215 towards the exhaust aperture 217, and is discharged from the exhaust aperture 217 at the lower portion of the module case 215 to the exhaust vent duct 291. The cooling air flows that have been discharged from the assembled battery modules 210 to the exhaust vent duct 291 come together in the interior of the exhaust vent duct 291, and are then discharged from the opening portion of the exhaust vent duct 291 into the interior of the casing 900. And this cooling air that has been discharged into the interior of the casing 900 is then discharged to the exterior from the exhaust aperture 920.

Next, a summary of the operation of this storage battery system 1000 will be explained with reference to FIGS. 1 through 8. During discharge of the battery, the voltages, currents, and temperatures of the various battery blocks are detected through the corresponding sensors by the respective local battery control devices 220, 320, 420, and 520, the power levels that can be outputted from the assembled battery module sets 200, 300, 400, and 500 are calculated on this basis of this data, and this data is notified to the master battery control device 100. And, as data for the storage battery system 1000, the master battery control device 100 totalizes this data comprising the voltages, currents, and temperatures of the various battery blocks acquired by the local battery control devices 220, 320, 420, and 520 and the power levels that can be outputted and so on, calculates the total power that can be outputted by the storage battery system 1000, and notifies this data to the motor control device 11. And, on the basis of this data, the motor control device 11 takes out power from the assembled battery module sets 200, 300, 400, and 500 via the positive and negative terminals 600 and 610, and utilizes this power for driving the electric motor 4.

On the other hand, during charging of the battery, supply of power is received from the electric motor 4 on the vehicle side via the positive and negative input and output terminals 600 and 601, so that the assembled battery module sets 200, 300, 400, and 500 are charged up. At this time, the local battery control devices 220, 320, 420, and 520 detect the voltages, currents, and temperatures with the various sensors, calculate the amounts of power that can be inputted on the basis of this data, and notify this data to the master battery control device 100. And, as data for the storage battery system 1000, the master battery control device 100 totalizes this data inputted from the local battery control devices 220, 320, 420, and 520 and the power levels that can be outputted and so on, calculates the total power that can be inputted to the storage battery system 1000, and notifies this data to the motor control device 11. Moreover, the motor control device 11 supplies charging power on the basis of this data for the total amount of power that can be inputted and so on.

The temperatures of the assembled battery modules 210, 211, 310, 311, 410, 411, 510, and 511 detected by the temperature sensors 270, 370, 470, and 570 are not only used for calculating the amounts of power that can be inputted and outputted, as described above; also, if any one of these detected temperatures is higher than an upper limit temperature that is set in advance, the corresponding one of the local battery control devices 220, 320, 420, and 520 notifies upper limit temperature excess information to the master battery control device 100. And, via the CAN, the master battery control device 100 notifies the motor control device 11 that one of the battery upper limit temperatures has been exceeded, and requests the motor control device 11 to open the main contactors 800, 801, 810, and 811 that are provided between the storage battery system 1000 and the vehicle side. When these main contactors 800, 801, 810, and 811 are opened, the input and output of electrical power to and from the storage battery system 1000 are intercepted, so that the storage battery system 1000 is put into a usage prohibited state.

It should be understood that the calculation of the allowable input/output power and the protection of upper limit temperature, as described above, may also be performed by detecting the inflow side temperatures and the outflow side temperatures of the cooling air currents that are blown by the cooling fans 280, 380, 480, and 580 into the cases of the assembled battery modules 210, 211, 310, 311, 410, 411, 510, and 511 with temperature sensors.

Next, the fault diagnostics for this storage battery system 1000 will be explained. It should be understood that, while in the following the fault diagnostics for the assembled battery module set 200 will be explained, the fault diagnostics for the other assembled battery module sets 300, 400, and 500 are performed in a similar manner. In the assembled battery module set 200, a voltage sensor 260 is provided for detecting the total voltage of the assembled battery modules 210 and 211. On the other hand, the voltage of each of these unit battery modules could also be detected by the cell control device 230. Moreover, it would also be possible for the operational state of each of the assembled battery modules 210 and 211 to be detected by the cell control device 230. However, since it takes a certain time for the voltages of both of the assembled battery modules 210 and 211 to be detected by the cell control device 230, in normal battery control, the voltages detected by the cell control device 230 are not utilized; rather, the value detected by the voltage sensor 260 is employed, since it is capable of detecting voltage in a short time period.

On the other hand, in relation to the current, detection with the current sensor 250 is employed for control. Moreover, in relation to the temperature, a plurality of temperature sensors 270 are provided to the assembled battery module set 200, and, from the values detected by this plurality of temperature sensors 270, the highest temperature, the minimum temperature, the average temperature or the like is calculated and is used in control.

The local battery control device 220 inputs the values detected by the voltage, current, and temperature sensors upon a fixed cycle. If a fault has occurred in any one of these sensors, the detected value inputted from that sensor is not reliable, so that it cannot be utilized for control; and accordingly diagnosis is performed to determine whether or not these sensors are operating correctly, and, if it is determined that a fault is occurring, this fact is notified to the master battery control device 100. For example, if the value detected by one of the sensors is outside a reference range that has been set in advance, it may be determined that some anomaly has occurred with that sensor, and it may be determined that a fault is occurring.

Now, the method of control in a prior art type storage battery system will be explained by taking, as an example, the case in which a fault is occurring in the voltage sensor 260. If the value detected by the voltage sensor 260 of the assembled battery module set 200 is outside a reference range that has been set in advance, then it is determined that some fault has occurred with that sensor. For example, if one of the connection wires to the voltage sensor 260 has broken, then its detected value becomes zero, so that it may be determined that a fault has occurred. Then, via the CAN, the local battery control device 220 notifies the occurrence of this fault to the master battery control device 100.

And, along with notifying the occurrence of this fault in the voltage sensor 260 to the motor control device 11 via the CAN, the master battery control device 100 also requests the motor control device 11 to open the main contactors 800, 801, 810, and 811 that are provided between the storage battery system 1000 and the vehicle side. When these main contactors 800, 801, 810, and 811 are opened, the input and output of electrical power to and from the storage battery system 1000 are intercepted, so that the storage battery system 1000 is put into a usage prohibited state. Moreover, even if the voltage sensor 260 recovers from this fault, the usage prohibited state continues until the storage battery system 1000 is restarted.

The above described fault diagnosis operation for the storage battery system 1000 is not limited to the use of the voltage sensor 260; the same operation is performed for all of the other sensors, such as current sensors and temperature sensors and so on.

<Battery Life Determination>

Next, the life determination method for this battery module portion consisting of the four assembled battery module sets 200, 300, 400, and 500 connected in a series parallel structure (refer to FIG. 2) will be explained.

A first resistance value table shown in Table 1 and a second resistance value table shown in FIG. 2 are stored in advance in a non-volatile EEPROM (not shown in the figures) of the master battery control device 100.

TABLE 1

Example of a first resistance value table

| | SOC | | | | | | | | | | |
|---|---|---|---|---|---|---|---|---|---|---|---|
| Temperature | 0% | 10% | 20% | 30% | 40% | 50% | 60% | 70% | 80% | 90% | 100% |
| −30° C. | 60 mΩ | 50 mΩ | 45 mΩ | 40 mΩ | 38 mΩ | 36 mΩ | 34 mΩ | 33 mΩ | 32 mΩ | 31 mΩ | 30 mΩ |
| −20° C. | 40 mΩ | 35 mΩ | 30 mΩ | 28 mΩ | 26 mΩ | 24 mΩ | 22 mΩ | 20 mΩ | 18 mΩ | 17 mΩ | 16 mΩ |
| −10° C. | 20 mΩ | 17 mΩ | 16 mΩ | 15 mΩ | 14 mΩ | 13 mΩ | 12 mΩ | 11 mΩ | 10 mΩ | 10 mΩ | 10 mΩ |
| 0° C. | 15 mΩ | 14 mΩ | 12 mΩ | 11 mΩ | 10 mΩ | 9 mΩ | 8 mΩ | 8 mΩ | 7 mΩ | 7 mΩ | 6 mΩ |
| 10° C. | 8 mΩ | 8 mΩ | 8 mΩ | 7 mΩ | 7 mΩ | 7 mΩ | 6 mΩ | 6 mΩ | 6 mΩ | 5 mΩ | 5 mΩ |
| 30° C. | 6 mΩ | 6 mΩ | 6 mΩ | 5 mΩ | 5 mΩ | 5 mΩ | 5 mΩ | 4 mΩ | 4 mΩ | 4 mΩ | 4 mΩ |
| 50° C. | 4 mΩ | 4 mΩ | 4 mΩ | 4 mΩ | 4 mΩ | 4 mΩ | 4 mΩ | 4 mΩ | 4 mΩ | 4 mΩ | 4 mΩ |

TABLE 2

Example of a second resitance value table.

| | SOC | | | | | | | | | | |
|---|---|---|---|---|---|---|---|---|---|---|---|
| Temperature | 0% | 10% | 20% | 30% | 40% | 50% | 60% | 70% | 80% | 90% | 100% |
| −30° C. | 40 mΩ | 35 mΩ | 30 mΩ | 28 mΩ | 26 mΩ | 25 mΩ | 24 mΩ | 23 mΩ | 22 mΩ | 21 mΩ | 20 mΩ |
| −20° C. | 25 mΩ | 22 mΩ | 18 mΩ | 17 mΩ | 16 mΩ | 15 mΩ | 14 mΩ | 12 mΩ | 11 mΩ | 11 mΩ | 10 mΩ |
| −10° C. | 16 mΩ | 14 mΩ | 13 mΩ | 13 mΩ | 12 mΩ | 12 mΩ | 11 mΩ | 10 mΩ | 9 mΩ | 9 mΩ | 9 mΩ |
| 0° C. | 12 mΩ | 11 mΩ | 11 mΩ | 10 mΩ | 10 mΩ | 8 mΩ | 8 mΩ | 7 mΩ | 7 mΩ | 6 mΩ | 6 mΩ |
| 10° C. | 7 mΩ | 7 mΩ | 7 mΩ | 7 mΩ | 7 mΩ | 6 mΩ | 6 mΩ | 6 mΩ | 6 mΩ | 6 mΩ | 5 mΩ |
| 30° C. | 5 mΩ | 5 mΩ | 5 mΩ | 5 mΩ | 4 mΩ | 4 mΩ | 4 mΩ | 4 mΩ | 4 mΩ | 4 mΩ | 3 mΩ |
| 50° C. | 3 mΩ | 3 mΩ | 3 mΩ | 3 mΩ | 3 mΩ | 3 mΩ | 3 mΩ | 3 mΩ | 3 mΩ | 3 mΩ | 3 mΩ |

The first resistance value table shown in FIG. 1 is a table in which, for the battery module portion that consists of the four assembled battery module sets 200, 300, 400, and 500 (refer to FIG. 2) connected in a series-parallel structure, the resistance values that have been measured while flowing a constant charge/discharge current in the battery module portion while changing the temperature and the SOC are held. On the other hand, the second resistance value table shown in FIG. 1 is a table in which the resistance values that have been measured while flowing a current of a specified change pattern in the battery module portion while changing the temperature and the SOC of the battery module portion are held. This specified current change pattern may be a change pattern in which the current increases linearly along with the passage of time, or a pulsed current pattern of a predetermined width, or the like. The resistance values of the battery module portion are measured under these measurement conditions before shipment of the battery module portion, and are stored in the non-volatile EEPROM (not shown in the figures) of the master battery control device 100. And, from among first resistance value tables and second resistance value tables that have been constructed in different measurement conditions, an appropriate table that matches the measurement conditions is selected according to the environmental conditions, and the life of the battery module portion is determined on the basis of this resistance value table that has been selected.

Figure 9:
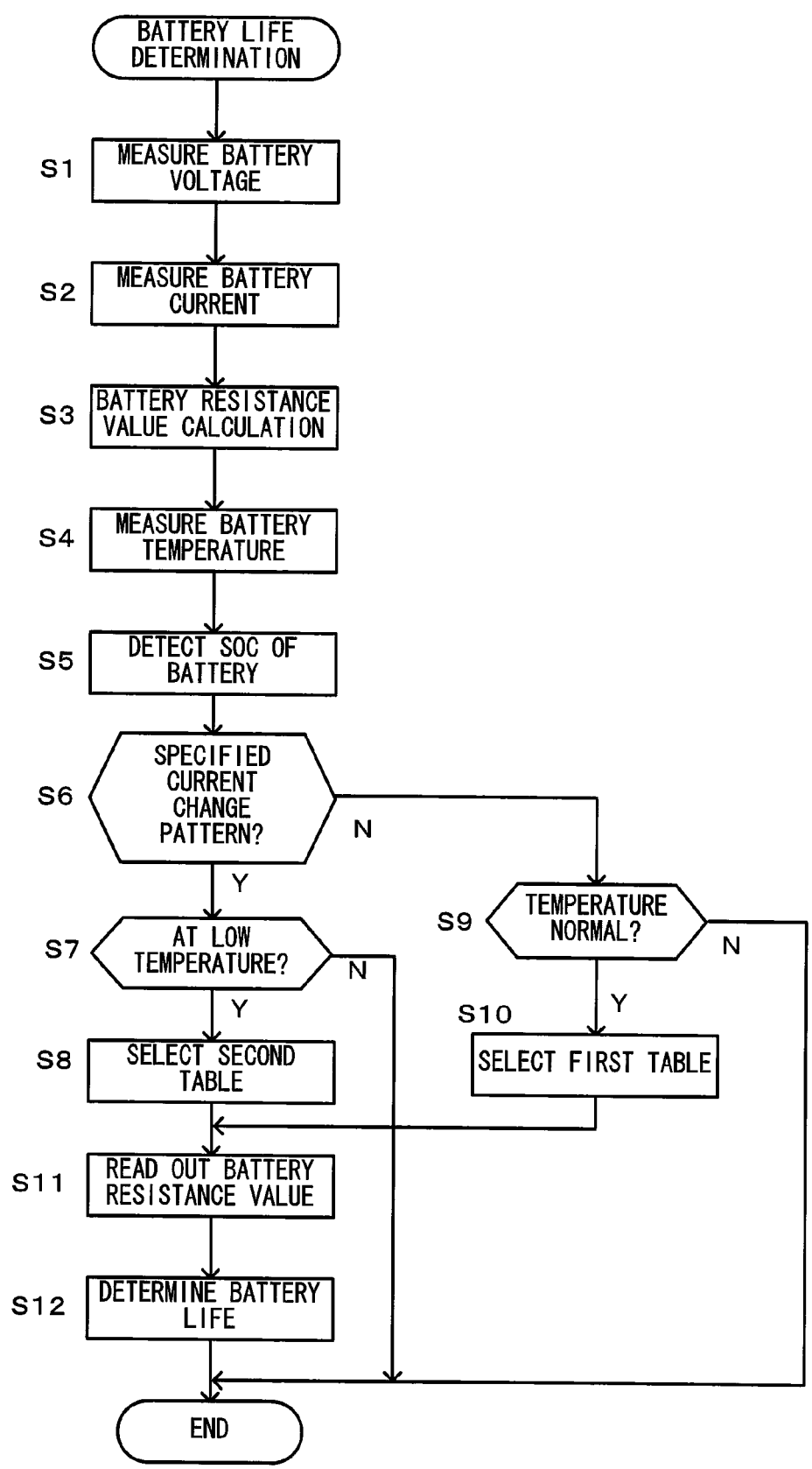
FIG. 9 is a flow chart showing a battery life determination program executed by this embodiment of the present invention.

FIG. 9 is a flow chart showing the flow of control of a battery life determination program of the storage battery system of this embodiment. The operation of this embodiment will now be explained with reference to this flow chart. The master battery control device 100 executes this battery life determination program at predetermined battery life determination intervals. In a step S1, the voltage between the two sides of the battery module portion, in other words the total voltage, is measured by the voltage sensor 130 (refer to FIG. 2), and then in the next step S2 the charge/discharge current that is flowing in the battery module portion is measured by the current sensor 120 (refer to FIG. 2). Then in a step S3 the resistance value of the battery module portion is calculated on the basis of the total voltage and the charge/discharge current of the battery module portion that have thus been measured. And then in a step S4 the temperatures in the battery module portion are measured by the temperature sensors 270, 370, 470, and 570 (refer to FIG. 2), and then in the next step S5 the SOC of the battery module portion is detected by the local battery control devices 220, 320, 420, and 520 (refer to FIG. 2).

In the step S6, a decision is made as to whether or not a specified current change pattern is present. The second power conversion device 7 (refer to FIGS. 1 and 2) controls the discharge current from the storage battery system 1000 to the motor-generator 4 (during battery discharge) and the charge current from the motor-generator 4 to the storage battery system 1000 (during battery charging), according to a command signal from the motor control device 11 (refer to FIGS. 1 and 2). If the change pattern of the charge or discharge current flowing in the storage battery system 1000 is a specified change pattern, for example a change pattern in which the current increases linearly along with the passage of time, or a pulse current change pattern of a predetermined time width, then the flow of control proceeds to a step S7, in which a decision is made as to whether or not the battery temperature measured in the step S4 is within a low temperature range, for example from −20° C. to +10° C. If the temperature of the battery module portion is low, then the flow of control proceeds to a step S8, in which the above described second resistance value table (refer to Table 2) is selected. It should be understood that no life decision is performed for the battery module portion if the battery module portion is not at low temperature, even if the flow of current in the storage battery system 1000 is exhibiting the specified change pattern.

On the other hand, if the charge/discharge current flowing in the battery storage system 1000 does not exhibit any specified change pattern, then the flow of control is transferred to a step S9, in which a decision is made as to whether or not the battery temperature measured in the step S4 is within a normal temperature range, for example from +10° C. to +40° C. If the temperature of the battery module portion is normal, then the flow of control proceeds to a step S10, in which the above described first resistance value table (refer to Table 1) is selected. It should be understood that no life decision is performed for the storage battery system if the battery module portion is not at normal temperature. And in the next step S11 a resistance value is read out from the first or the second resistance value table that was selected, according to the battery temperature measured in the step S4 and the SOC detected in the step S5. Then in the final step S12 the current resistance value of the battery module portion that was calculated in the step S3 and the resistance value upon shipment that was read out in the step S11 are compared together, and a determination is made of the state of deterioration of the battery module portion, on the basis of the proportion of increase of the current resistance value with respect to the resistance value upon shipment. For example, if the current resistance value has increased to 200% of the resistance value upon shipment, then it may be determined that the battery module portion of this storage battery system 1000 has arrived at the end of its life.

In this manner, according to this embodiment, a plurality of resistance tables for the battery are measured in advance and stored, according to the temperature and the SOC of the battery when currents of different change patterns flow in the battery, and, along with the resistance value of the battery being calculated on the basis of the voltage and the current of the battery, also a resistance value table is selected from among the plurality of resistance value tables corresponding to the change pattern of the current flowing in the battery when the voltage and the current of the battery are measured, and a resistance value is found from this selected resistance value table corresponding to the temperature and the SOC of the battery when the voltage and the current of the battery were measured. And, since it is arranged to compare the calculated resistance value with the resistance value that has been found and thereby to perform a determination of battery life, accordingly it is possible to select a resistance value table from among the plurality of resistance value tables that match the state of use of the battery, so that it is possible to determine the life of the battery in an accurate manner.

Moreover, according to this embodiment, both a first resistance value table for when a constant current flows in the battery while the temperature of the battery is at normal temperature within a predetermined range, and a second resistance value table for when a current of a specified change pattern flows in the battery while the temperature of the battery is at a temperature lower than a predetermined temperature, are measured in advance and stored; and, along with calculating a resistance value for the battery on the basis of the voltage and the current of the battery, the first resistance value table or the second resistance value table is selected according to the change pattern of the current flowing in the battery and the temperature of the battery, and a resistance value is found from the selected resistance value table corresponding to the temperature and the SOC of the battery when the voltage and the current of the battery were measured. And, since it is arranged to compare together the calculated resistance value and the resistance value that has been found, and thereby to determine a life for the battery, accordingly it is possible to select, from among the first resistance value table and the second resistance value table, that resistance value table that matches the state of usage of the battery, so that thereby it is possible to determine the life of the battery in a more accurate manner.

It should be understood that while, in the battery life determination method described above, an example was described in which the battery life determination was performed at predetermined intervals, it would also be acceptable to arrange to receive a battery life determination command from the motor control device 11 (incorporated in the second power conversion device 7; refer to FIGS. 1 and 2) that manages the overall charge and discharge control of the storage battery system 1000, or from a yet higher level vehicle control device 41 (FIG. 1), and to execute the battery life determination procedure described above when this battery life determination command is received.

Furthermore while, in the battery life determination method described above, an example was described in which the storage battery system 1000 measured the pattern of the charge/discharge current flowing in the battery module portion and the temperature of the battery module portion while the hybrid automobile was being driven, and performed battery life determination when these parameters satisfied predetermined conditions, it would be appropriate to arrange to send a battery life determination command and a change pattern command for the current flowing in the motor-generator 4 from a vehicle control device 41 (FIG. 1) to the motor control device 11 and to the master battery control device 100 of the storage battery system 1000, or from the motor control device 11 to the master battery control device 100 of the storage battery system 1000, thus controlling the second power conversion device 7 with the motor control device 11 to flow a constant current or a current of the above described specified change pattern in the motor-generator 4, and to perform the battery life determination described above by the master battery control device 100 of the storage battery system 1000. In this case, branching should be performed in the step S6 of FIG. 9 according to the change pattern of the current; in other words, the change pattern of the current flowing in the battery module should not be measured, but rather program branching should be performed corresponding to the change pattern command for the current that has been received from the vehicle control device 41.

Furthermore while, in the embodiment described above, an example was described in which the battery life determination procedure was performed by flowing current to the motor-generator 4 for driving the movement of the vehicle, it would also be acceptable to arrange to perform this battery life determination by flowing current to the motor-generator 3 that is principally used for generating electrical power. In this case, it would be appropriate to arrange to send a battery life determination command and a change pattern command for the current flowing in the motor-generator 3 from a vehicle control device 41 (FIG. 1) to the motor control device 11 and to the master battery control device 100 of the storage battery system 1000, thus controlling the first power conversion device 6 with the motor control device 11 to flow a constant current or a current of the above described specified change pattern in the motor-generator 3, and to perform the battery life determination described above by the master battery control device 100 of the storage battery system 1000. In this case as well, branching should be performed in the step S6 of FIG. 9 according to the change pattern of the current; in other words, the change pattern of the current flowing in the battery module should not be measured, but rather program branching should be performed corresponding to the change pattern command for the current that has been received from the vehicle control device 41. According to this method of performing battery life determination by driving the motor-generator 3 as a load upon the engine 2, it is possible to execute battery life determination without any requirement for the hybrid automobile 1 to be moving, and accordingly it is possible to perform this battery life determination process in a safer manner.

And moreover while, in the embodiment described above, an example was described in which the first resistance value table was employed when a constant charge/discharge current flowed in the storage battery system 1000, and the second resistance value table was employed when a current flowed of a specified change pattern, for example a change pattern in which the current increased linearly along with the passage of time, or a pulsed current change pattern of a predetermined time width, or the like, this is not to be considered as being limitative of the present invention; it would also be acceptable to arrange to construct resistance value tables for yet further current change patterns, and to utilize a resistance value table according to the actual change pattern of the current. In concrete terms, among the above described specific current change patterns, both a resistance value table for the case of the current increasing linearly along with the passage of time, and a resistance value table for a pulsed current pattern of a predetermined time width, are prepared separately, and the appropriate one of these change patterns is selected according to the actual change pattern of the charge/discharge current that flows in the storage battery system 1000. It is possible to further enhance the reliability of determination of battery life by providing more resistance value tables corresponding to more types of change pattern of current.

And also while, in the embodiment described above, an example was described in which battery life determination was executed for the overall battery module portion that consisted of the four assembled battery module sets 200, 300, 400, and 500 (refer to FIG. 2) connected in a series-parallel structure, it would also be acceptable to arrange to perform a similar battery life determination procedure for each of the four assembled battery module sets 200, 300, 400, and 500 individually. In this case, along with measuring the voltage between the two ends of each of the assembled battery module sets with the voltage sensors 260, 360, 460, and 560, the current flowing in each of the assembled battery modules, and the patterns of change of these currents, are measured with the current sensors 250, 350, 450, and 550, and also the temperature of each of the assembled battery module sets is measured with the temperature sensors 270, 370, 470, and 570, and the SOC of each of the assembled battery module sets is detected by the local battery control devices 220, 320, 420, and 520. Furthermore, along with calculating a battery resistance value for each of the assembled battery module sets 200, 300, 400, and 500, as described above, for each of the four assembled battery module sets, according to the change pattern of the current and the temperature of that assembled battery module set, a first resistance value table or a second resistance value table is selected, and a resistance value for each of the assembled battery module sets is found from its selected resistance value table, according to the temperature and the SOC of that assembled battery module set. And, for each of the assembled battery module sets 200, 300, 400, and 500, its calculated resistance value and its resistance value found from its selected resistance value table are compared together, and battery life determination is performed as described above on the basis of the result of that comparison. It should be understood that it would also be acceptable to arrange to implement battery life determination by a similar method for each of the assembled battery modules 210, 310, 410, and 510 that are yet smaller. By implementing battery life determination for each of the battery modules in the storage battery system 1000 in this manner, it is possible to implement maintenance such as battery exchange or the like for each of the assembled battery modules, so that it is possible to improve the economical application and utilization of resources.

It should be understood that the term "assembled battery" in the above description is explained as a lower component of a battery module set or of an assembled battery module. However, the term "assembled battery" is used to mean an aggregate of a plurality of lithium battery cells, where a plurality of lithium battery cells are assembled. Further, this aggregate is often also called as "battery group". Therefore, the terms "assembled battery" or "battery group" may include also the meanings of terms such as "assembled battery", "assembled battery unit", "assembled battery block", "assembled battery module", "battery module set", "battery module block", and "battery module portion", which are used in the above description.

It should be also understood that in the above description of the battery control device according to the present invention, the description is given for the "assembled battery" where the assembled battery cells are assumed to be lithium battery cells. However, the present invention is also applicable to the "assembled battery" of other types of battery cells, when these cells are the types of rechargeable ones.

The embodiments described above are examples, and various modifications can be made without departing from the scope of the invention.

What is claimed is:

1. A battery control device, comprising:
a voltage measurement unit that measures a voltage of a assembled battery in which a plurality of battery cells are connected together;
a current measurement unit that measures a current flowing in the assembled battery and a change pattern of that current;
a temperature measurement unit that measures a temperature of the assembled battery;
a SOC detection unit that detects a state of charge (SOC) of the assembled battery;
a storage unit that stores a plurality of resistance value tables of the assembled battery with respect to the temperature and the SOC of the assembled battery, measured in advance when currents of different change patterns flow in the assembled battery;
a calculation unit that calculates a resistance value for the assembled battery, based upon the voltage and the current of the assembled battery;
a search unit that selects, from among the plurality of resistance value tables stored in the storage unit, a resistance value table that corresponds to a change pattern of the current flowing in the assembled battery when the voltage and the current of the assembled battery were measured, and finds a resistance value from that resistance value table corresponding to the temperature and the SOC of the assembled battery when the voltage and the current of the assembled battery were measured; and
a determination unit that compares together the resistance value calculated by the calculation unit and the resistance value found by the search unit, and determines a life for the assembled battery.

2. A battery control device according to claim 1, wherein:
in the plurality of resistance value tables stored in the storage unit, there are included a first resistance value table for when a constant current flows in the assembled battery while the temperature of the assembled battery is at a normal temperature within a predetermined range, and a second resistance value table for when a current of a specified change pattern flows in the assembled battery while the temperature of the assembled battery is at a temperature lower than a predetermined temperature; and the search unit selects the first resistance value table or the second resistance value table, according to the change pattern of the current flowing in the assembled battery and the temperature of the assembled battery.

3. A battery control device that controls a storage battery system in which a plurality of assembled batteries, in each of which a plurality of battery cells are connected, are connected in series, or in parallel, or in series-parallel, comprising:

a voltage measurement unit that measures a voltage of each assembled battery;

a current measurement unit that measures a current flowing in the each assembled battery and a change pattern of the current;

a temperature measurement unit that measures a temperature of the each assembled battery;

a SOC detection unit that detects a state of charge (SOC) of the each assembled battery;

a storage unit that stores a plurality of resistance value tables of the each assembled battery with respect to the temperature and the SOC of the each assembled battery, measured in advance when currents of different change patterns flow in the each assembled battery;

a calculation unit that calculates a resistance value for the each assembled battery, based upon the voltage and the current of the each assembled battery;

a search unit that selects, from among the plurality of resistance value tables stored in the storage unit, a resistance value table that corresponds to the change pattern of the current flowing in the each assembled battery when the voltage and the current of the each assembled battery was measured, and finds resistance values from the selected resistance value table corresponding to the temperature and the SOC of the each assembled battery when the voltage and the current of the each assembled battery were measured; and a determination unit that compares together, for the each assembled battery, the resistance value calculated by the calculation unit and the resistance value found by the search unit, and determines a life for the each assembled battery.

4. A battery control device according to claim 3, wherein:

in the plurality of resistance value tables stored in the storage unit, there are included a first resistance value table for when a constant current flow in the each assembled battery while the temperature of the each assembled battery is at a normal temperature within a predetermined range, and a second resistance value table for when a current of a specified change pattern flows in the each assembled battery while the temperature of the each assembled battery is at a temperature lower than a predetermined temperature; and the search unit selects the first resistance value table or the second resistance value table, according to the change pattern of the current flowing in the each assembled battery and the temperature of the each assembled battery.

5. A battery control device that is used together with a power conversion device that converts DC power of a assembled battery in which a plurality of battery cells are connected into AC power and supplies that AC power to a predetermined load, and that performs a life decision for the assembled battery upon receipt of a command from the power conversion device to flow a current of a predetermined change pattern from the assembled battery to the predetermined load and to perform a life decision for the assembled battery, comprising:

a voltage measurement unit that measures a voltage of the assembled battery;

a current measurement unit that measures a current flowing in the assembled battery;

a temperature measurement unit that measures a temperature of the assembled battery;

a SOC detection unit that detects a state of charge (SOC) of the assembled battery;

a storage unit that stores a resistance value table of the assembled battery with respect to the temperature and the SOC of the assembled battery, measured in advance when current of the predetermined change pattern flows in the assembled battery;

a calculation unit that calculates a resistance value for the assembled battery, based upon the voltage and the current of the assembled battery;

a search unit that finds a resistance value from the resistance value table in the storage unit, corresponding to the temperature and the SOC of the assembled battery when the voltage and the current of the assembled battery were measured; and a determination unit that compares together the resistance value calculated by the calculation unit and the resistance value found by the search unit, and determines a life for the assembled battery.

6. A battery control device that is used together with a power conversion device that converts DC power of a storage battery system in which a plurality of assembled batteries, in each of which a plurality of battery cells are connected, and that are connected in series, or in parallel, or in series-parallel, into AC power and supplies the AC power to a predetermined load, and that performs life decisions for the assembled batteries upon receipt of a command from the power conversion device to flow a current of a predetermined change pattern from the battery group to the predetermined load and to perform life decisions for the assembled batteries, comprising:

a voltage measurement unit that measures a voltages of each assembled battery;

a current measurement unit that measures a current flowing in the each assembled battery;

a temperature measurement unit that measures a temperatures of the each assembled battery;

a SOC detection unit that detects a state of charge (SOC) of the each assembled battery;

a storage unit that stores a resistance value table of the each assembled battery with respect to the temperature and the SOC of the each assembled battery, measured in advance when current of the predetermined change pattern flows in the each assembled battery;

a calculation unit that calculates a resistance value for the each assembled battery, based upon the voltage and the current of the each assembled battery;

a search unit that, for the each assembled battery, finds a resistance value from the respective resistance value table for the each assembled battery in the storage unit, corresponding to the temperature and the SOC of the each assembled battery when the voltage and the current of the each assembled battery were measured; and a determination unit that, for the each assembled battery, compares together the resistance value calculated by the calculation unit and the resistance value found by the search unit, and determines a life for the each assembled battery.

\* \* \* \* \*